US006468021B1

(12) United States Patent
Bonora et al.

(10) Patent No.: US 6,468,021 B1
(45) Date of Patent: Oct. 22, 2002

(54) INTEGRATED INTRA-BAY TRANSFER, STORAGE, AND DELIVERY SYSTEM

(75) Inventors: Anthony C. Bonora, Menlo Park; Richard H. Gould, Fremont; Michael Brain, San Jose; David V. Adams, Belmont, all of CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/461,498

(22) Filed: Dec. 14, 1999

Related U.S. Application Data

(60) Provisional application No. 60/112,947, filed on Dec. 18, 1998.

(51) Int. Cl.[7] .............................. B65G 15/58; B65H 1/00
(52) U.S. Cl. ..................... 414/522; 414/217; 198/468.6
(58) Field of Search ...................... 198/468.11, 468.6, 198/469.1, 470.1; 414/217, 940, 225

(56) References Cited

U.S. PATENT DOCUMENTS

| | | | |
|---|---|---|---|
| 4,005,786 A | 2/1977 | Adelson et al. | 214/16.4 A |
| 4,718,536 A | 1/1988 | Toby | 198/469.1 |
| 4,787,804 A | 11/1988 | Edenäs | 414/281 |
| 4,964,776 A | 10/1990 | Wakita et al. | 414/277 |
| 4,996,753 A * | 3/1991 | Jones | 901/41 X |
| 5,061,144 A | 10/1991 | Akimoto et al. | 414/225 |
| 5,163,802 A | 11/1992 | Poinelli | 414/555 |
| 5,273,392 A | 12/1993 | Bernard, II et al. | 414/786 |
| 5,363,867 A | 11/1994 | Kawano et al. | 134/95.2 |
| 5,387,265 A | 2/1995 | Kakizaki et al. | 29/25.01 |
| 5,411,358 A | 5/1995 | Garric et al. | 414/277 |
| 5,443,346 A | 8/1995 | Murata et al. | 414/222 |
| 5,464,313 A | 11/1995 | Ohsawa | 414/172 |
| 5,562,383 A | 10/1996 | Iwai et al. | 414/217 |
| 5,570,990 A | 11/1996 | Bonora et al. | 414/543 |
| 5,628,604 A | 5/1997 | Murata et al. | 414/225 |
| 5,679,055 A * | 10/1997 | Greene et al. | 451/10 X |
| 5,680,936 A | 10/1997 | Beers | 209/564 |
| 5,980,183 A | 11/1999 | Fosnight | 414/222.01 |
| 6,042,166 A * | 3/2000 | Conte | 901/37 X |

* cited by examiner

Primary Examiner—Christopher P. Ellis
Assistant Examiner—Gene O. Crawford
(74) Attorney, Agent, or Firm—Fliesler Dubb Meyer & Lovejoy LLP

(57) ABSTRACT

An integrated intra-bay transfer, storage and delivery system is provided for moving an article between a conveyor and a station such as a work station. The system includes a transfer assembly which includes a lift mechanism and a displacement mechanism. The transfer assembly transfers the article between the conveyor system and a buffer or storage station for storage of the article. A delivery robot transfers the article between the buffer or storage station and a work station for delivery to the station. The robot includes a vertical movement mechanism and a horizontal movement mechanism. The robot also includes an arm that is adapted to grip the article, particularly an article of a standard configuration having a mushroom-shaped handle on top. The arm engages the handle and lifts the article or transport pod from the storage station to a load port of the work station. In one embodiment, the arm includes a C-shaped adaptation that passively engages the handle from a side thereof. In other embodiments, the arm includes an actuator coupled to an assembly that actively grips the handle from above. Advantages of the invention include the ability to safely move the transport pod from a elevated storage station to the lower placed storage stations or load ports of a work station.

19 Claims, 22 Drawing Sheets

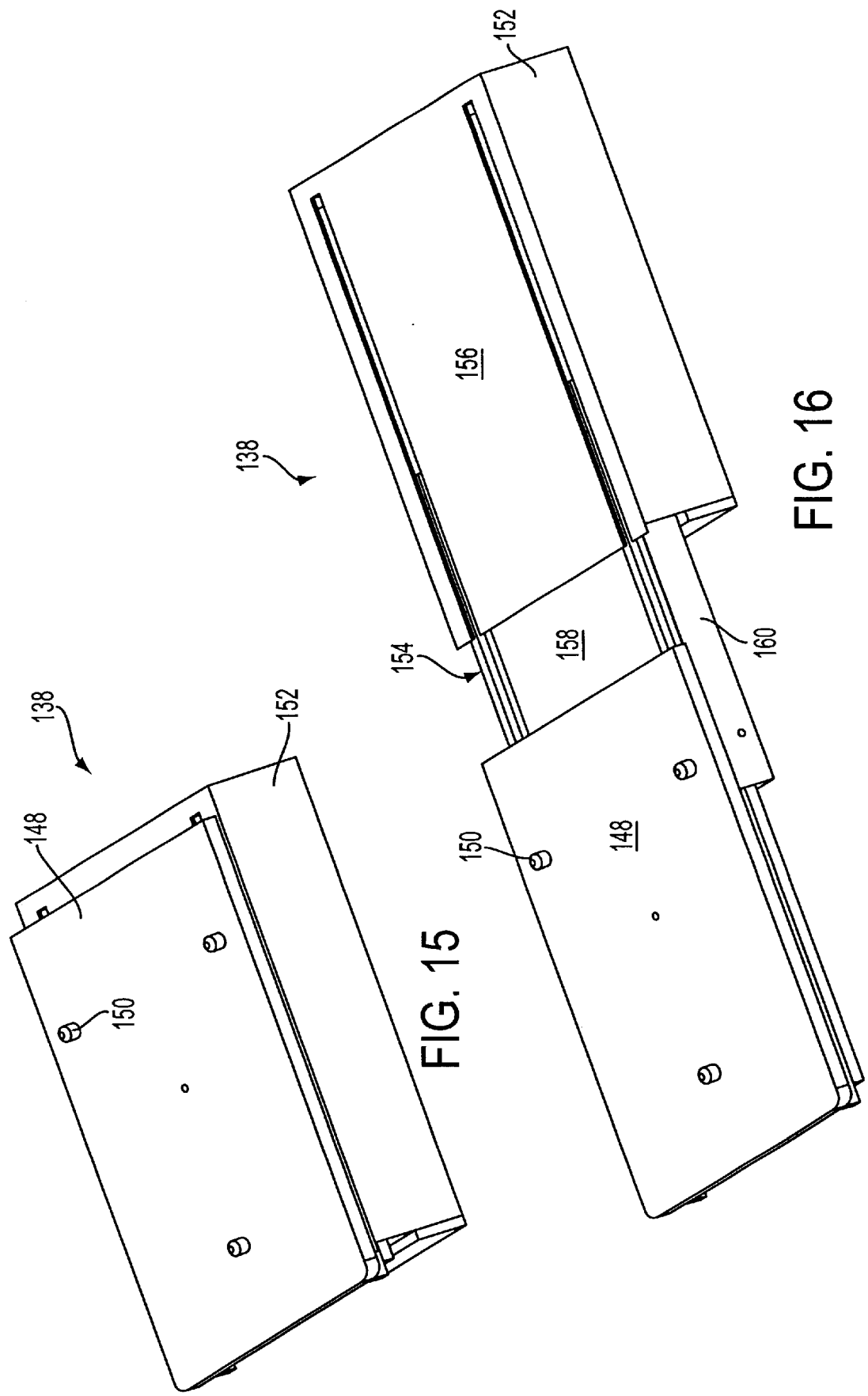

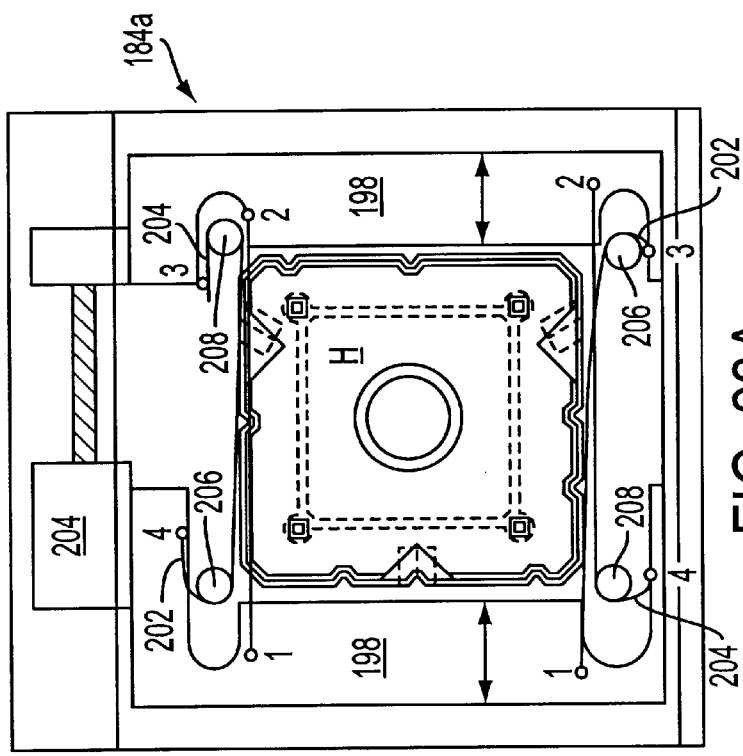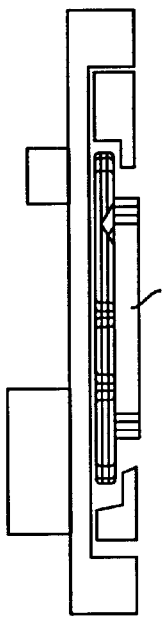
FIG. 23A
FIG. 23B
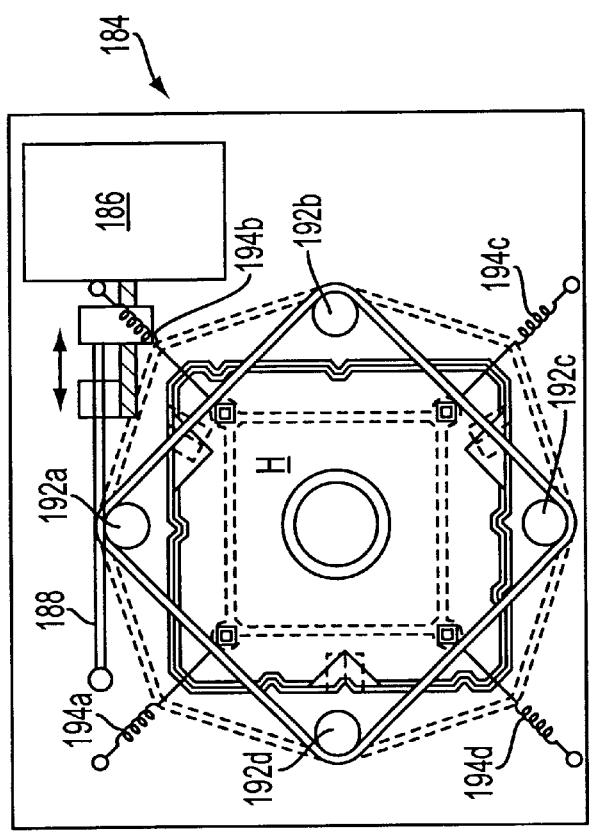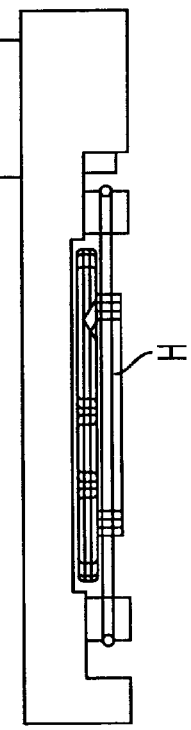
FIG. 22A
FIG. 22B

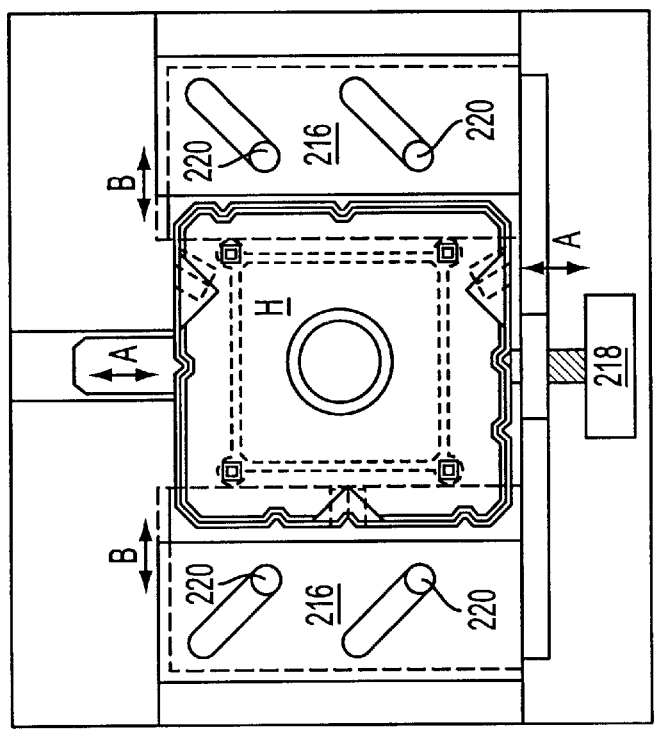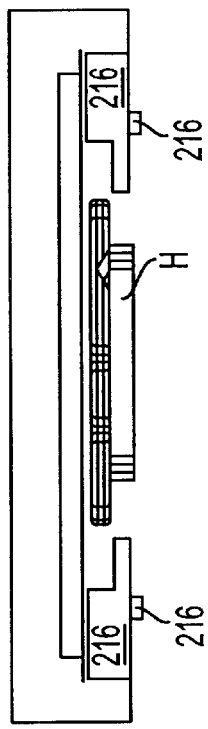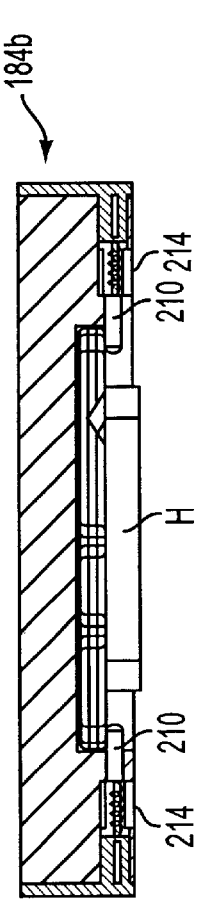

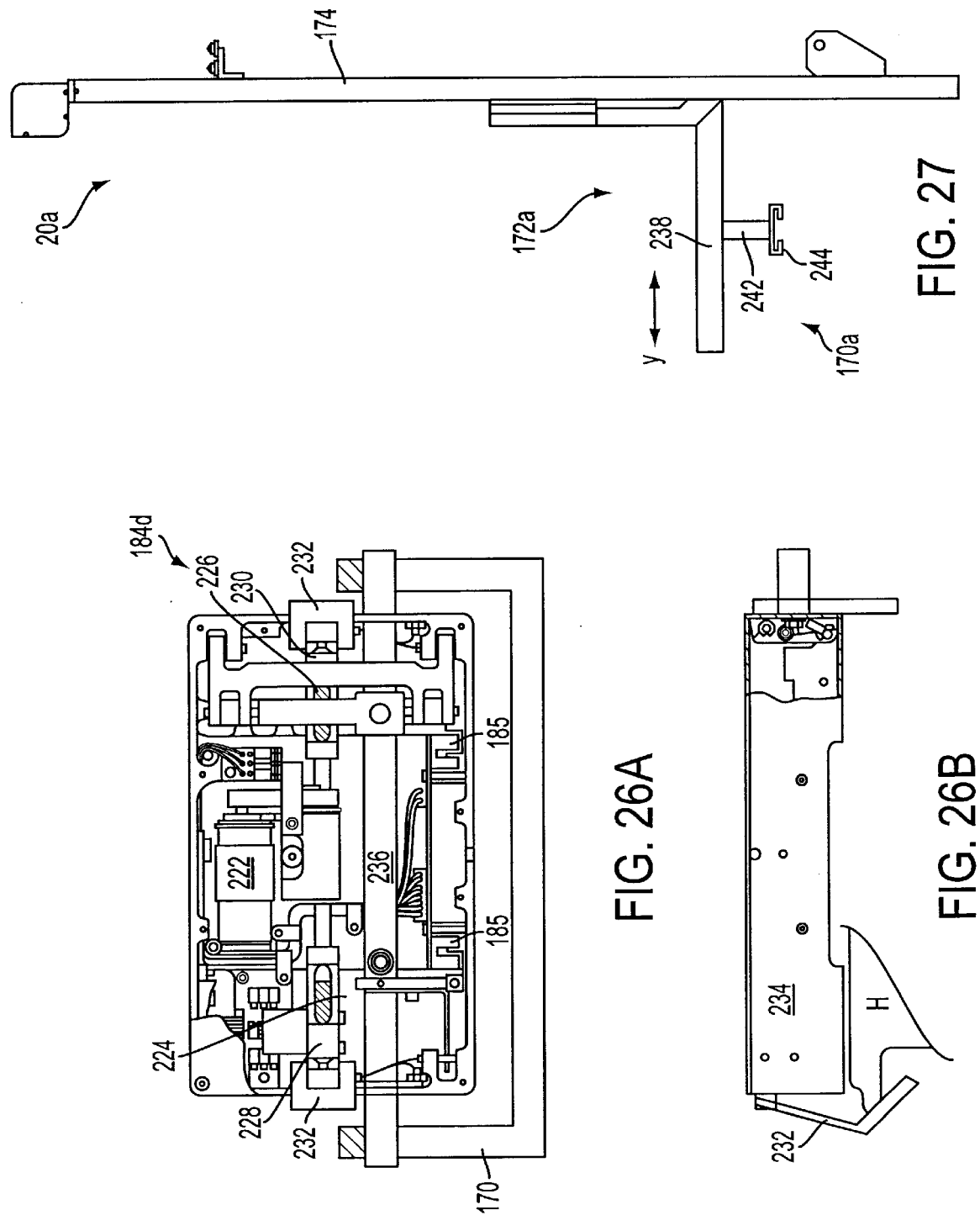

INTEGRATED INTRA-BAY TRANSFER, STORAGE, AND DELIVERY SYSTEM

RELATED APPLICATIONS

This application claims priority to U.S. Provisional Patent Application Ser. No. 60/112,947 filed Dec. 18, 1998, entitled INTEGRATED POD TRANSFER SYSTEM, the entire contents of which is incorporated herein by this reference.

This application incorporates by reference, U.S. patent application Ser. No. 09/103,479 filed Jun. 24, 1998, and U.S. patent application Ser. No. 09/212,002 filed Dec. 14, 1998, the entire disclosure of which is herein incorporated by reference.

BACKGROUND OF THE INVENTION

1. Field of the Invention

The present invention relates generally to a system for transferring articles and, more particularly, to an integrated intra-bay transfer, storage, and delivery system for transferring an article between a conveyor which moves the articles along a conveyor path and a storage shelf, storing the article on the storage shelf, and delivering the article to a work station.

2. Description of Related Art

In various fields, delicate or valuable articles must be safely transported between work stations and the like without damaging or destroying the articles. Articles requiring careful handling include, but are not limited to, pharmaceuticals, medical systems, flat panel displays, computer hardware such as disc drive systems, modems and the like, and semiconductor wafers. The articles are often transported from station to station, such as a work station, by a conveyor. In many situations, the articles must be temporarily removed from the conveyor for processing. Preferably, the operation of the conveyor is not interrupted while the article is removed from the conveyor. After the processing has been completed, the articles must then be carefully returned to the conveyor for transport to the next work station.

In the field of semiconductor processing, for example, a manufacturing facility is typically organized into a plurality of bays each including several processing machines. FIG. 1 shows a known exemplary bay 8 having several processing machines 16 including, but not limited to, equipment for depositing films on the wafers, for cleaning and/or conditioning the wafers at various stages, and the like. As known in the art, the entrance of the processing machine is often provided with a load port 22 where the wafers may be automatically removed from a transport pod 12 or other container in a protected environment. A known load assembly 10 loads pod 12 on load port 22. Once pod 12 is properly positioned at load port 22, pod 12 is automatically opened and the wafers are extracted from pod 12 by robotic devices. A conveyor 14 moves pods 12 from processing machine 16 to processing machine 16. An inter-bay conveyor pods 12 between the bays, with stockers 24 transferring pods 12 between the inter-bay conveyor and conveyor 14.

With many applications, the value of the articles increases after the articles are processed at each work station. For example, integrated circuits are manufactured by forming a plurality of layers on a substrate such as a semiconductor wafer. The work stations used to form integrated circuits include machines for depositing the individual layers as well as machines for cleaning and/or conditioning the substrate at various stages. With advances in technology, integrated circuits have become increasingly complex and typically include multiple layers of intricate wiring. The size of the integrated circuits has decreased, greatly increasing the number of such devices on a single wafer. As a result of the increased complexity and decreased size of the integrated circuits, the value of the semiconductor wafer increases substantially as the wafer progresses through the various processing stages. The standard size of semiconductor wafers will increase from 200 mm to 300 mm or larger in the next few years, further increasing the number of integrated circuits which may be formed on a single wafer and therefore the value of each wafer. For articles such as semiconductor wafers, considerable care must be taken when handling the articles to reduce the risk of damaging the articles and incurring significant monetary losses. It is readily apparent that the inherent workers safety hazards and the risk of material damage when handling the articles increases as semiconductor wafer size increases.

Some articles, such as semiconductor wafers, must be retained in a clean room environment during processing to preserve the purity of the layers deposited on the wafer. The requirement of a clean room environment places additional constraints on the handling of these articles. For additional protection against contaminants, the semiconductor wafers are typically retained in a device, such as a sealed pod, as they are moved throughout the manufacturing facility to minimize any exposure to the environment outside of the processing machines. The pods are used to transport the articles along the conveyor.

The inlets of the semiconductor processing machines often include a load port for the automatic removal of the wafers from the pod in a protected environment. The load port shelf may be moved a limited distance, on the order of a couple of inches, to move the pod toward and away from a load port seal at the machine entrance. This horizontal shifting of the pod is minimal and does not serve any function in the movement of the pod to the load port or the transfer of the pod between the conveyor and load port.

As noted above, multiple processing machines are generally located in a tool bay. Often a stocker system is used to store pods before or after the pods are processed or in between processes when aped is transferred between several processing machines. A stocker is typically a large unit having a plurality of shelves on which the pods may be stored and a transport system for moving pods into, within, and out of the stocker. Accordingly, a stocker generally occupies a significant amount of bay space which might otherwise provide space for additional processing machines. Such a stocker system is also used to transfer pods from an inter-bay conveyor to an intra-bay conveyor as is shown in FIG. 1. One should appreciate that the amount of time an article spends within a stocker as well as the time it takes to transport an article to or from a stocker represents lost processing time of that article.

U.S. Pat. No. 5,980,183 to William J. Fosnight discloses an integrated intrabay buffer delivery, and stocker system which transfers and stocks wafer-carrying pods between various processing tools within a bay of a semiconductor wafer. The system disclosed by the Fosnight patent relies on a shuttle to transfer the pods between an inter-bay transport, various processing tools, and storage shelves. The processing throughput of the system disclosed by the Fosnight patent may be limited due to the bottle neck created where the shuttle transfers the pods to and from the interbay transport.

A simplified system for safely and accurately moving a transport pod or other article between a conveyor system and a work station without a stocker is desirable. An article transfer system which may be used to move and buffer the articles without significantly disrupting the continued operation of the conveyor system is also desirable.

SUMMARY OF THE INVENTION

The integrated intra-bay transfer, storage, and delivery system of the present invention overcomes the above identified limitations and provides an integrated system capable of moving articles between a conveyor system and one or more work stations, for example, a load port of a work station. In particular, the integrated system of the present invention can move articles to one or more storage or buffer stations for temporary storage of an article as it is moved between the conveyor system and a work station without affecting other articles transported by the conveyor system. Storage or buffering stations located adjacent work stations are more efficient than conventional centralized stockers located adjacent an interbay transfer because less time is wasted transporting the article to and from the centralized stocker.

The integrated system of the present invention includes a transfer assembly which transfers articles between the conveyor system and the buffer stations where the articles are stored until they are delivered to the work stations by a delivery robot which moves the articles between the buffer stations and the work stations. It should be appreciated that the transfer assembly of the present invention can also be configured to move articles directly between the conveyor system and the work stations whereby the delivery robot subsequently moves the articles between one or more work stations and one or more buffer stations.

The transfer assembly includes an integral lift mechanism and a displacement assembly for lifting a pod from the conveyor system and moving it to a storage station.

Alternatively, the transfer assembly includes a lift assembly for lifting a pod from the conveyor system and a separate slide assembly for moving the pod to a storage station.

The delivery robot includes a vertical movement mechanism and a horizontal movement mechanism. Since each article often has a standard configuration, for example, a semiconductor transport pod having a mushroom-shaped handle on top, the robot includes a robot arm adapted to engage the article. The robot arm engages the handle and transports the article between a storage station and a work station. For example, the robot arm may be used to move a transport pod to a load port of a work station thus allowing a tool of the work station to access wafers in the transport pod for integrated circuit fabrication. In one embodiment, the arm includes a C-shaped adaptation that passively fits into the handle of the article from one side. In other embodiments, the arm includes an active gripper that grips the handle from above.

It is an object of the present invention to provide an integrated system able to transfer an article from a conveyor system to one or more work stations having the ability to store or buffer articles at one or more storage stations until such time that a work station is available for delivery of the article.

It is another object of the present invention to provide an integrated system to safely move the article between the conveyor system, the storage stations, and the work stations.

It is another object of the present invention to provide an integrated system to efficiently move the article between the conveyor system, the storage stations, and the work stations.

It is another object of the present invention to provide an integrated system capable of buffering an article at any location not occupied by a work station loading or I/O zone thus rendering conventional stockers unnecessary and freeing floor space for additional work stations.

BRIEF DESCRIPTION OF THE DRAWINGS

Additional objects and features of the invention will be more readily apparent from the following detailed description and appended claims when taken in conjunction with the drawings, in which:

FIG. 15 is a pictorial view of the support assembly of FIG. 12, shown with the shelf assembly in the closed position.

FIG. 16 is a pictorial view of the support assembly of FIG. 12, shown with the shelf assembly in the extended position.

FIGS. 22(a) and 22(b) are plan and side views, respectively, of a modified gripper assembly in accordance with the present invention.

FIGS. 23(a) and 23(b) are plan and side views, respectively, of another modified gripper assembly in accordance with the present invention.

FIG. 24 is a side view of another modified gripper assembly in accordance with the present invention.

FIGS. 25(a) and 25(b) are plan and side views, respectively, of another modified gripper assembly in accordance with the present invention.

FIGS. 26(a) and 26(b) are plan and side views, respectively, of yet another modified gripper assembly in accordance with the present invention.

FIG. 27 is a side view of a modified robot arm in accordance with the present invention.

DESCRIPTION OF THE PREFERRED EMBODIMENTS

Figure 1:
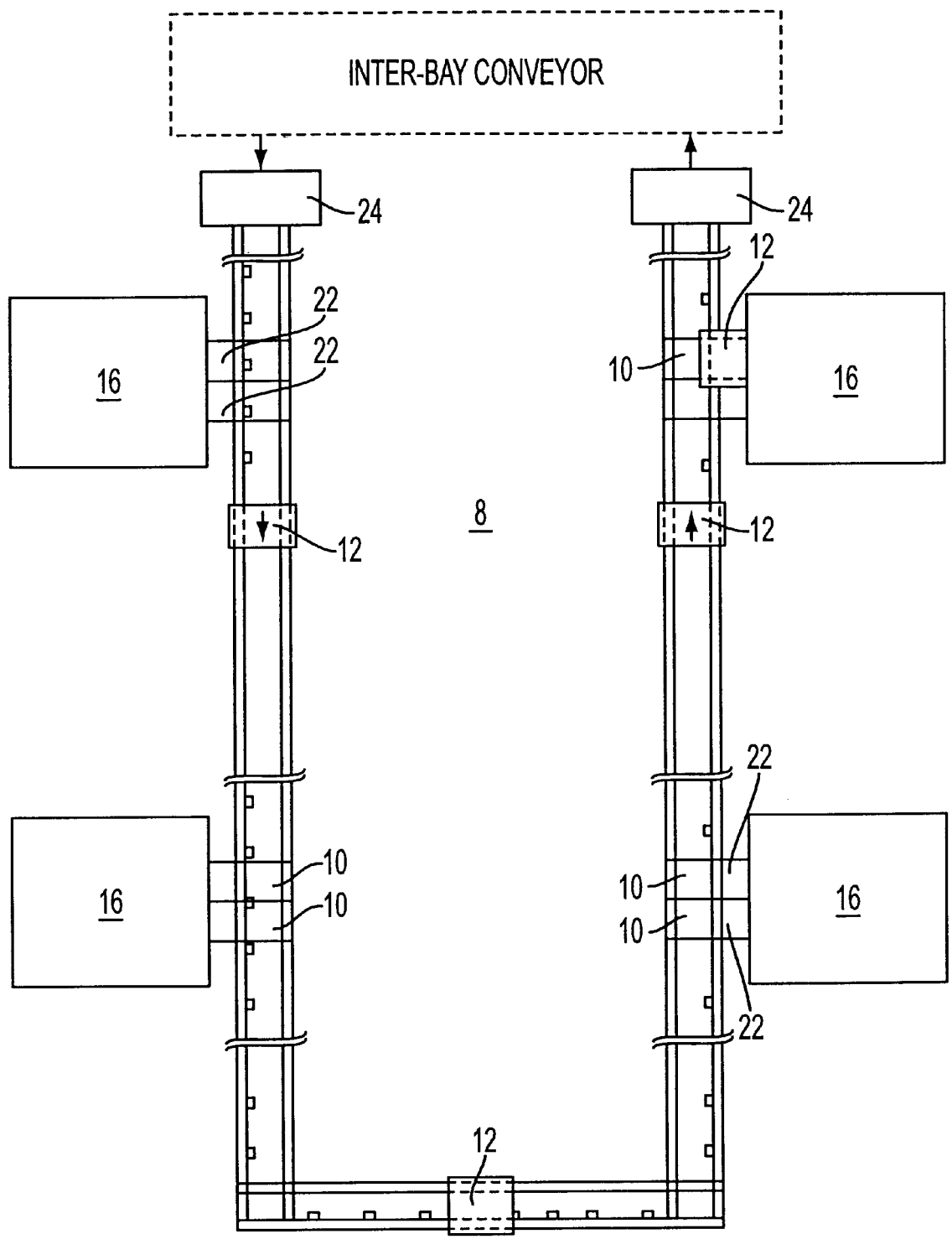
FIG. 1 is a schematic view of an exemplary known conveyor system.

Reference will now be made in detail to the exemplary embodiments of the invention, which are illustrated in the accompanying figures. Turning now to the drawings, like components are designated by like reference numerals throughout the various figures.

Referring to FIGS. 2–5, an integrated system 10 in accordance with the present invention is particularly suitable for transferring one or more articles, such as transport devices, transport pods 12 or other containers housing semiconductor wafers, between a conveyor system 14 and a station 16, such as a work station or a processing machine for processing silicon wafers transported by pods 12. A transfer assembly 18 is provided for moving articles 12 between conveyor system 14 and a storage or buffer station 19 where one or more articles 12 may be stored while temporarily removed from the conveyor system. It is to be understood that other stations may receive the articles for other functions. Delivery robot 20 transfers articles 12 between storage station 19 and work station 16. Storage stations 19 are located in a buffer zone and load ports 22 of work stations 16 are located in an I/O or input/output zone, as discussed in detail below. A travel zone is also provided which allows delivery robot 20 to move articles 12 from one zone to the next, as desired and described in detail below.

It is to be understood that the integrated system of the present invention is not to be limited to semiconductor processing. Instead of wafer transport, the integrated system may be used to transport other types of materials, particularly delicate materials where substantial care must be taken in handling the materials such as pharmaceuticals, medical systems, flat panel displays, hard disk drives and other types of computer equipment, and lithography reticles between a conveyor system and a station. The term "transport device," or "transport pod" is used throughout the description for convenience; however, it is to be understood that the integrated system of this invention may be used with any article, including but not limited to wafer transport pods, containers holding semiconductor wafers or other items, pallets, or articles which may be directly transported by the conveyor system without requiring a separate transport device, and empty containers.

Figure 2:
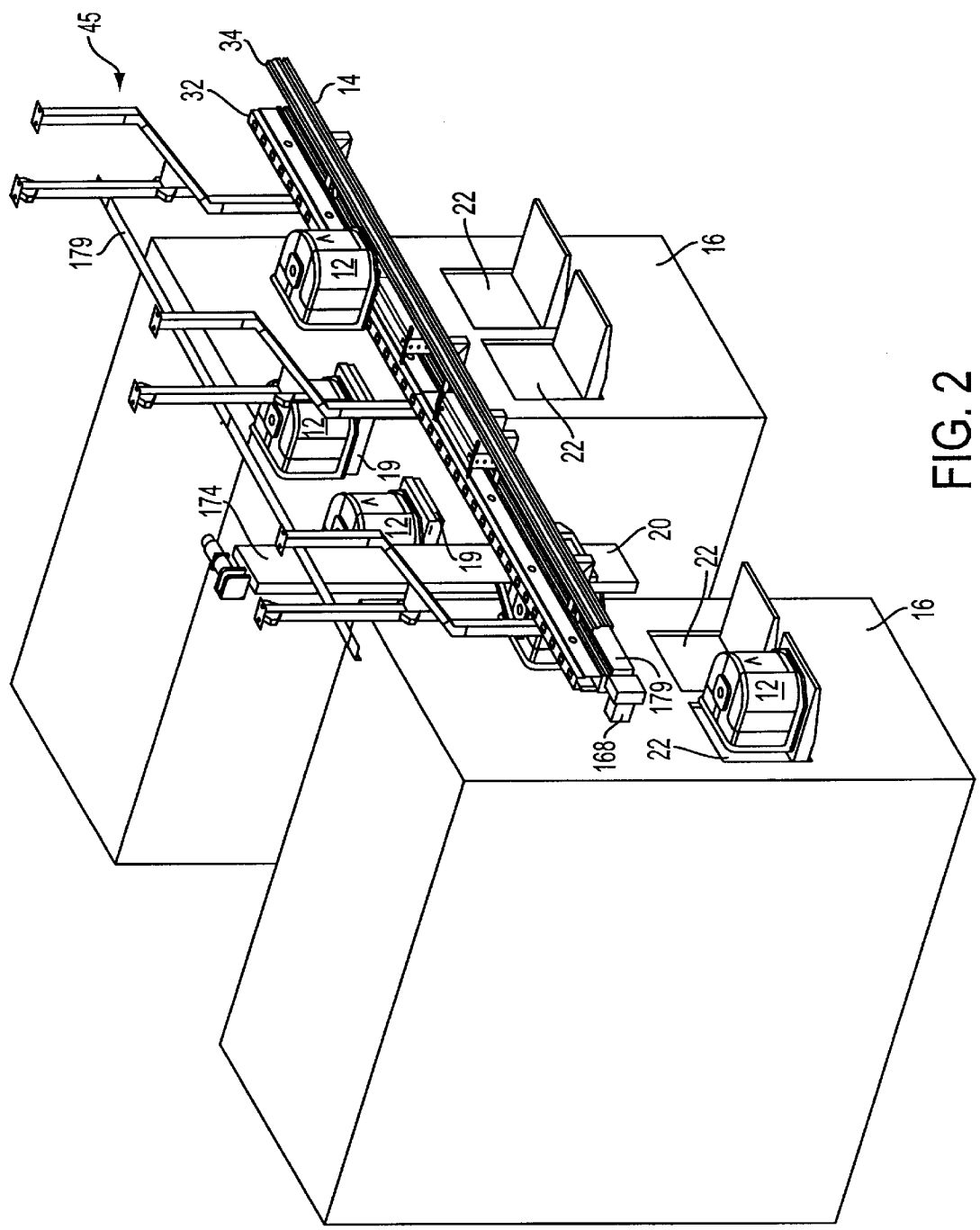
FIG. 2 is a perspective view of a transfer system according to the present invention showing a conveyor system, pods, load ports, storage shelves and a robot according to an embodiment of the present invention.
Figure 3:
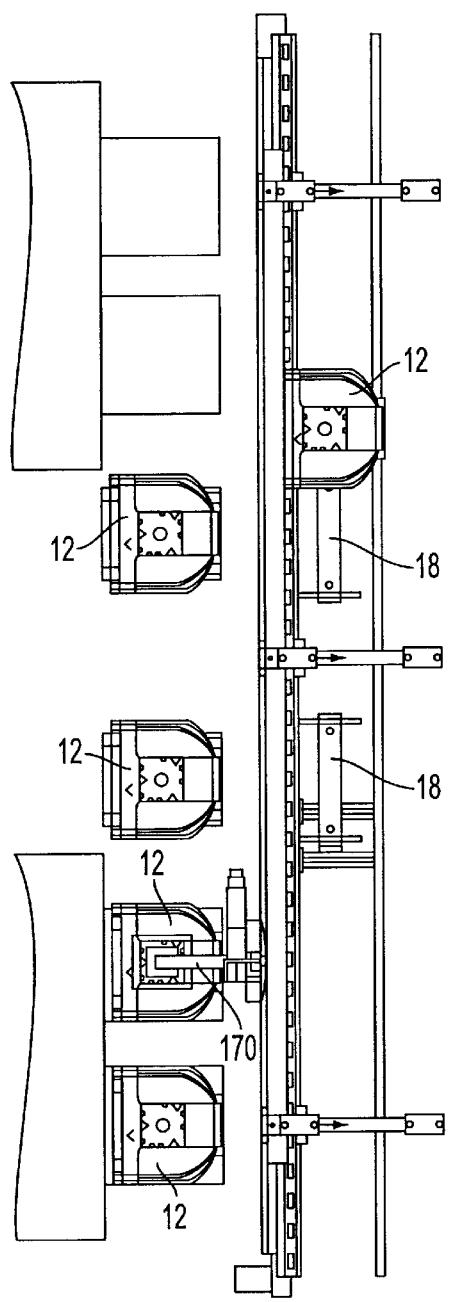
FIG. 3 is a top view of the transfer system of FIG. 2.

As noted above, a manufacturing facility is typically organized into a plurality of bays each including several work stations. FIG. 2 shows a portion of a bay housing two work stations 16 including, but not limited to, equipment for depositing films on the wafers, for cleaning and/or conditioning the wafers at various stages, and the like. As known in the art, the entrance of work station 16 is often provided with a load port 22 where the wafers may be automatically removed from pod 12 or other container in a protected environment. As described in more detail below, transfer assembly 18 of this invention transfers article or transport pod 12 between conveyor system 14 and storage station 19. Delivery robot 20 then transfers pod 12 from storage station 19 to load port 22 of a selected work station 16. Once the transport pod is properly positioned at load port 22, pod 12 is automatically opened and the wafers are extracted from the transport pod by robotic devices, which are not shown and do not pertain to the present invention. It is to be understood that the integrated system of this invention may be used with work stations 16 which do not include a load port provided that the work station includes a shelf, surface or other support on which the pod 12 may be positioned. Preferably, pods 12 are picked up and deposited at a work station at predetermined and repeatable positions.

Conveyor system 14 moves transport pods 12 at high speeds to a location in proximity to a work station 16. Buffer locations including storage stations 19 are also proximal to work station 16 for storing pods 12 until such time that the work station is available to receive the pod provided. Although only a portion of conveyor system 14 is shown in FIGS. 2–5, it should be appreciated that conveyor system 14 may be arranged in a generally continuous path or loop that runs from an interbay delivery system (not shown) to the end of the bay, and services both sides of the bay. Other configurations such as a bi-directional conveyor on each side of the bay may also be used. Conveyor system 14 may also include one or more cross-spurs or cross-branches which may be used as a shortcut to other areas of the bay.

Figure 4:
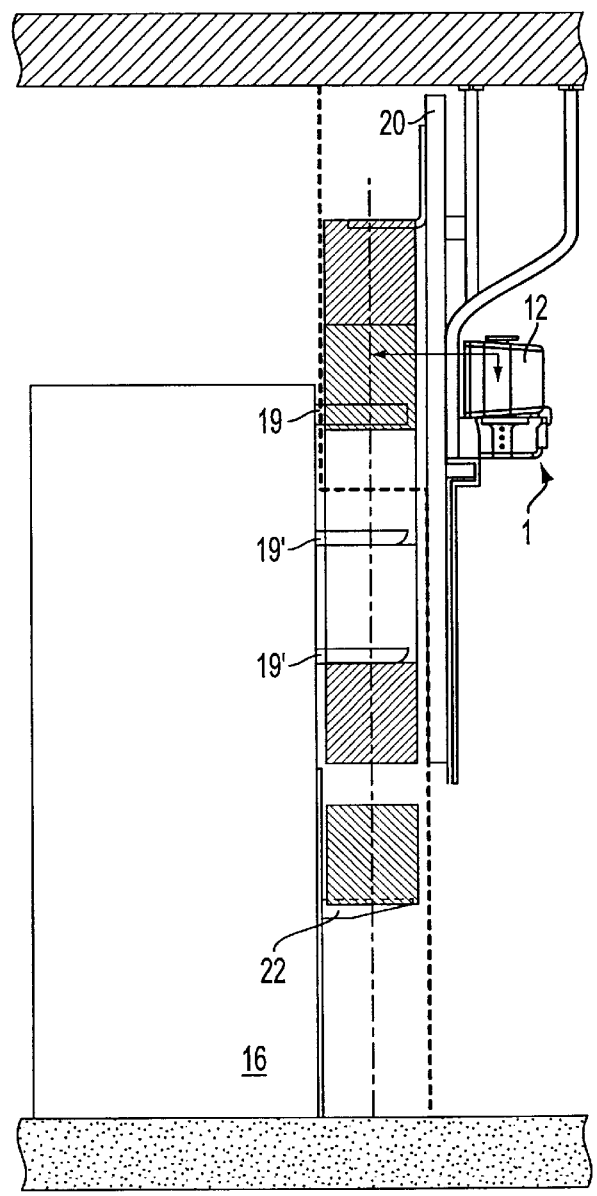
FIG. 4 is a side view of a modified transfer system similar to that shown in FIG. 2.

The configuration of the conveyor system 14 is subject to considerable variation depending upon the constraints of a particular manufacturing facility, including but not limited to ceiling heights, bay lengths, bay widths, and the number of work stations. Preferably, conveyor system 14 is elevated from the floor by approximately seven feet to allow easy human access to work station 16. As shown in FIG. 4, conveyor system 14 is preferably positioned in front of storage stations 19, however, it may be positioned behind storage stations 19 provided the ceiling height of the bay provides adequate space for the conveyor system above the work stations. One should also appreciate that the number of buffer, travel, and I/O zones, discussed in detail below, may also vary depending on the ceiling height of the bay.

Transfer assembly 18 is particularly suitable for use with a conveyor system of the type shown in shown in co-pending U.S. patent application Ser. No. 09/103,479, the disclosure of which is incorporated by reference herein. As shown for example in FIGS. 2 and 6, conveyor system 14 generally includes a pair of rails 32, 34 for supporting pod 12 as it is moved along a conveyor path. Rail 32 functions as a drive rail which propels and optionally guides pod 12 along rails 32, 34. All propulsion power for moving transfer pod 12 is supplied via drive rail 32. Power may be supplied to drive rail 32 via conventional means. Alternatively, power may be supplied to drive rail 32 by a power bus (not shown). Rail 34 is an idler or support rail with a primary function of supporting pod 12 such that it is held in a level orientation as it is moved along the conveyor path. Optionally, the support rail 34, as opposed to the drive rail 32, may be used to guide the transport pod as it travels along the conveyor system. Conveyor system 14 may also include a cart-like transport device for moving the wafers or other materials. In the embodiment shown in FIG. 6, the transport device is part of pod 12. In other embodiments of the invention, the transport device may be part of another container or article, or the transport device may be a separate device which may be used to transport materials along conveyor system 14.

Drive rail 32 includes a drive system, generally designated at 36, for propelling the pod 12 along rails 32, 34. In the illustrated embodiment of the invention, the drive system 36 includes a plurality of wheels 38 which project from the upper surface of the drive rail 34. Drive wheels 38 frictionally engage the underside of pod 12 to propel it along drive rail 32. Drive system 36 also includes means for driving wheels 38 such as motors and belts coupled to wheels 38. Preferably, the motors operate independently to provide a plurality of independently controlled drive zones such that the drive speed and direction (forward or reverse) of each zone may be independently controlled. Wheels 38 of adjacent operational zones are accelerated and decelerated at the same rate such that at the time of transfer, the speed imposed on pod 12 by the wheels in adjacent zones is synchronized at the time of transfer between the zones. As the pod is propelled along the conveyor system, only the operational zone directly below a transfer pod and one or more zones adjacent the transfer pod are active at any time. This reduces the power consumption of integrated system 10, extends the operational life of the components of drive system 36, and reduces the incidence of particular generation in the clean room environment of the bay.

Figure 5:
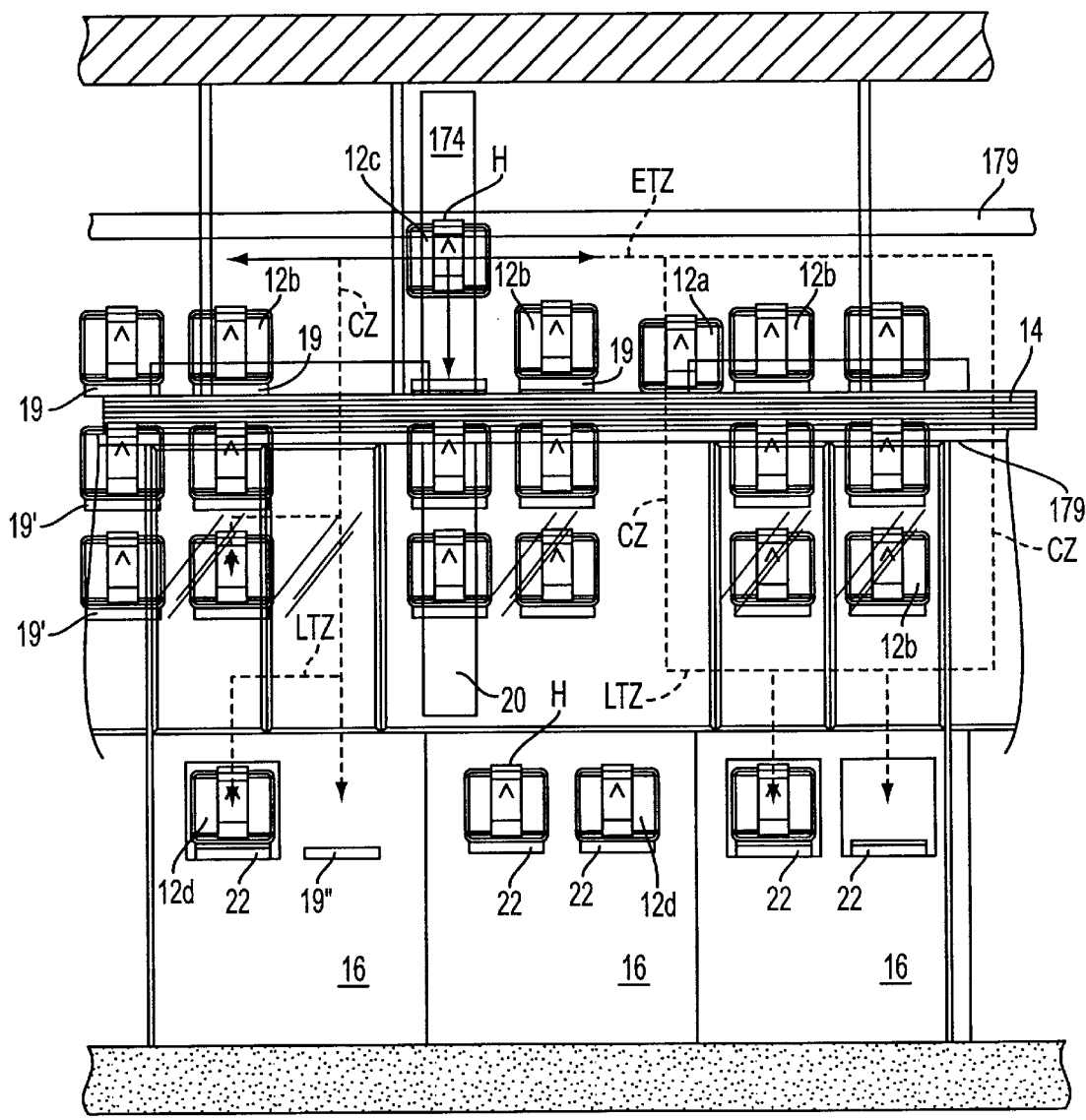
FIG. 5 is a front view of another modified transfer system similar to that shown in FIG. 2.

The operation of the drive system 36 is controlled by a control system. An exemplary control system 33 of the present invention is shown in FIG. 5. Control system 33 preferably includes a computer which controls activation of the conveyor system, the transfer assembly, the load ports of the work stations, and the work stations. Control system 33 also preferably includes one or more sensors to monitor the progress of the pods along the conveyor system. Such a control system is more fully described in co-pending U.S. patent application Ser. No. 09/212,002, filed Dec. 14, 1998, the entire disclosure of which is incorporated herein by reference. Control system 33 of the present invention also includes a delivery robot controller 35 which controls motion of delivery robot 20, as discussed below.

Figure 6:
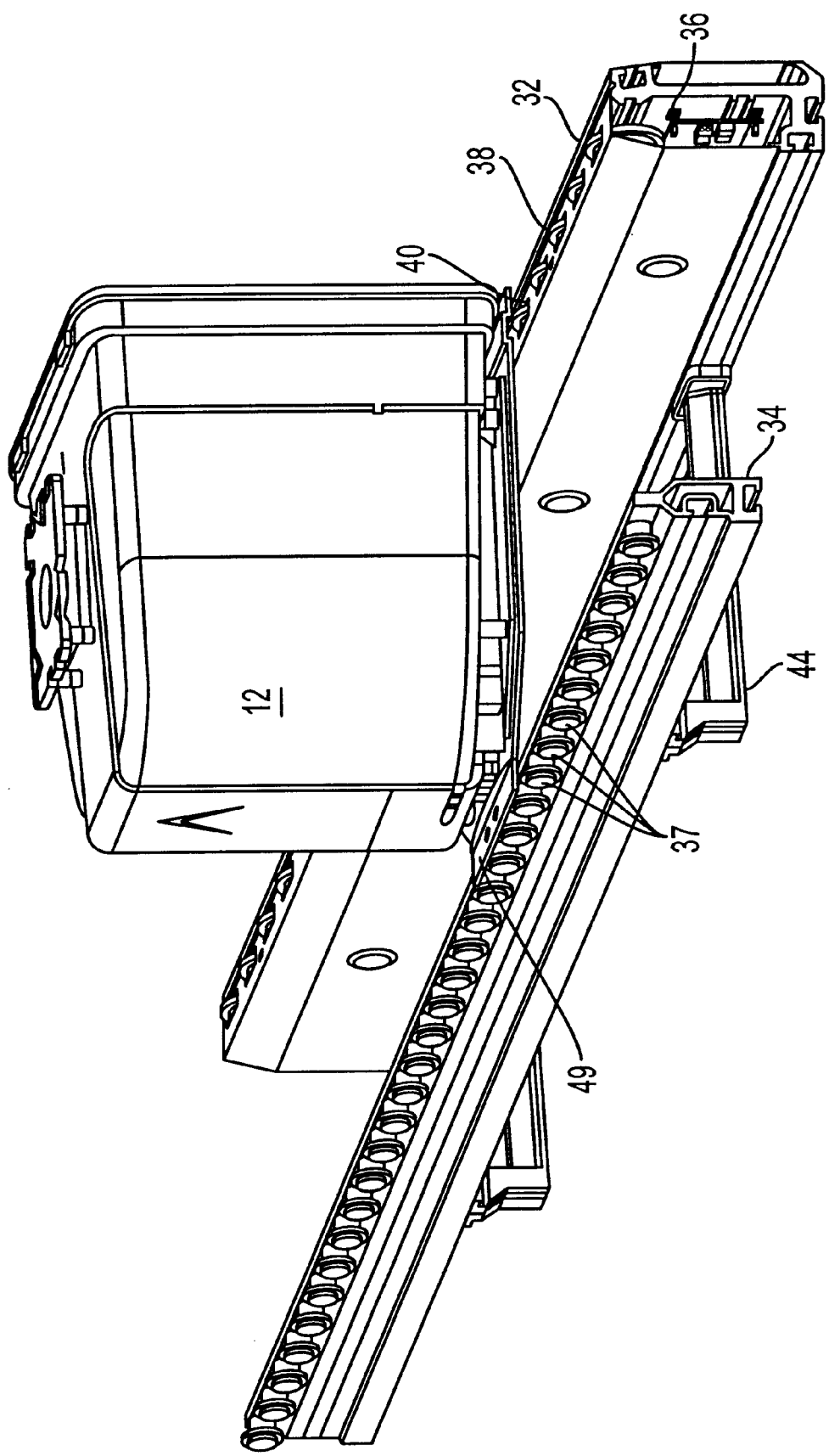
FIG. 6 is a pictorial view of a section of the conveyor system shown in FIG. 2 according to one embodiment of the present invention.
Figure 7:
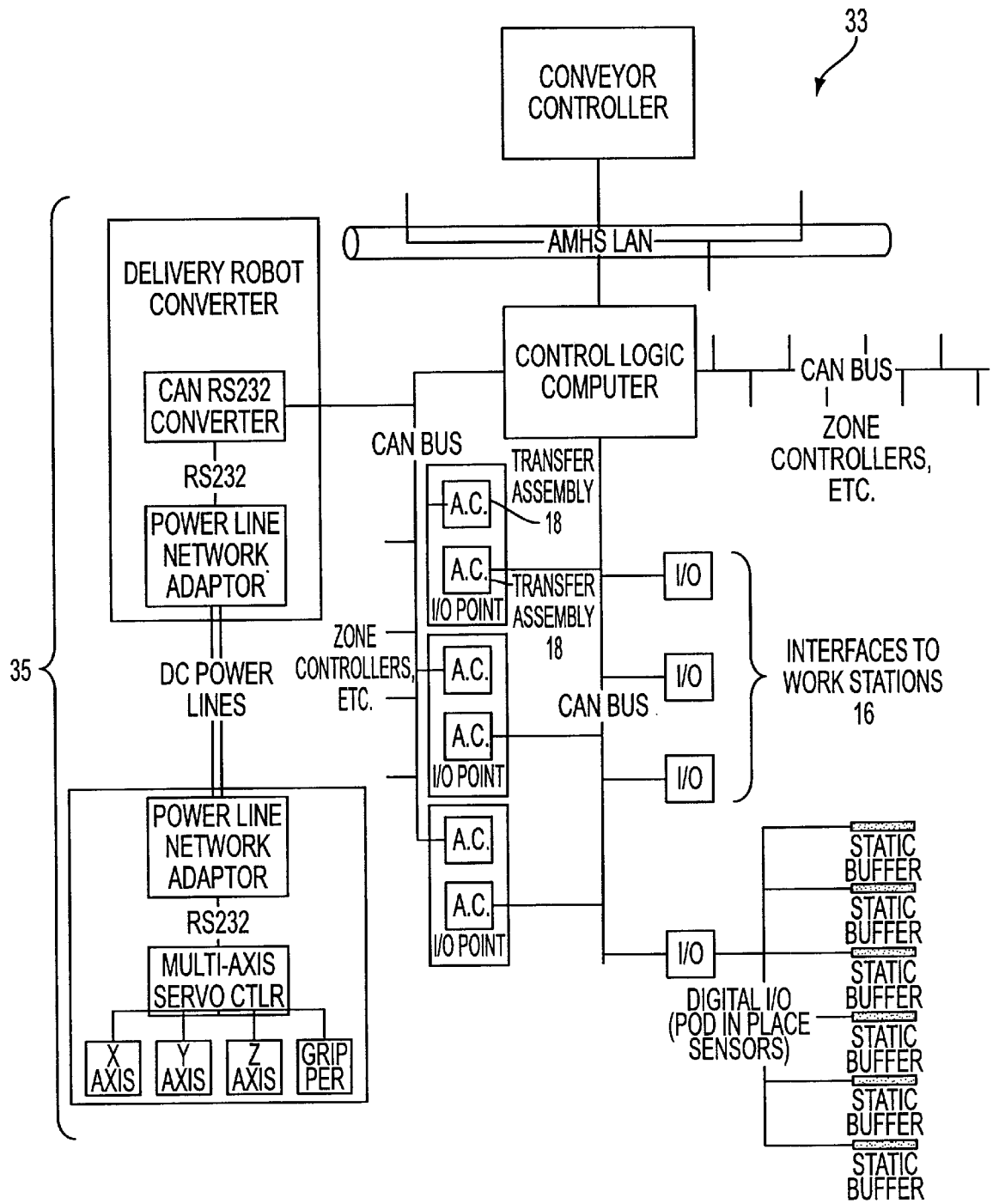
FIG. 7 is a schematic view of a control system in accordance with the present invention.

As shown in FIG. 6, drive wheel 38 engages a groove 40, or other suitable 5 surface, formed in the underside to pod 12 to propel and optionally to guide the pod along the conveyor path. Groove 40 defines a horizontal plane in which the pod sits on drive wheels 38. The engagement between drive wheels 38 and groove 40 controls lateral or side-to-side movement of pod 12 as well as vertical movement of pod 12. While the combination of groove 40 and drive wheels 38 is preferred, it is to be understood that groove 40 may be eliminated entirely provided the transport device, drive rail 32 or idler rail 34 includes a guiding device for guiding pod 12 as it moves along rails 32, 34.

Idler rail 34 is parallel to and spaced from the drive rail 32. One or more connectors 44 are mounted to rails 32,34 to maintain a predetermined spacing between the rails and facilitate installation of conveyor system 14. Rails 32, 34 and connectors 44 may be mounted to a suitable mounting frame suspended from the ceiling by an overhead frame or superstructure 45, as shown in FIGS. 2–5 and discussed in detail below. Alternatively, rails 32, 34 and connectors 44 may be supported directly or indirectly by the process tool or work station (not shown). Pod 12 rides along the upper surface of the idler rail 34, with the idler rail 34 cooperating with the transport device to support one side of pod 12.

A pad or cushion material 46 maybe provided along the upper surface of the rail 34 to provide pod 12 with a smoother ride although, if desired, the pad 46 may be omitted and pod 12 may ride directly on the upper surface of the rail 34. In a preferred embodiment, as shown in FIG. 6, rail 34 is provided with idler wheels 37 to provide pod 12 with a smooth ride. Alternatively, a pod, cushion or resilient material may be incorporated into the outer perimeter of the drive wheels (not shown). Transport device of pod 12 may also be provided with a shoe (not shown) which rides along the upper surface of idler rail 34 to minimize bumping, jolting or shimmying of the pod, allowing the pod to be moved in a smooth, controlled manner. One should appreciate that other suitable means may be employed to move the pod in a smooth and controlled manner.

Although in one embodiment integrated system 10 includes a transfer assembly 18 which is used with the conveyor system of co-pending U.S. patent application Ser. No. 09/103,479, it is to be understood that transfer assembly 18 may also be used with other types of conveyors to provide an integrated system in accordance with the present invention.

Transport pods 12 are automatically moved by transfer assembly 18 from conveyor 14 to storage station 19 for storage or buffering until delivery robot 20 transfers pods 12 to a work station 16, and vice versa. As discussed above, transfer assembly 18 is particularly suitable for use in the field of semiconductor processing, but may also be used for other applications within the scope of this invention.

In one embodiment illustrated in FIGS. 8–11, where transfer assembly 18 is used with conveyor system 14, pod 12 must be disengaged from conveyor system 14; that is, pod 12 must be sufficiently raised above rails 32, 34 so that groove 40 clears the drive rail 32 and the remainder of pod 12 clears both rails 32, 34. When pod 12 is returned to the conveyor system, pod 12 must be accurately aligned with conveyor system 14 so that groove 40, or other suitable surface, seats on the drive wheels 38 and pod 12 properly seats on both rails 32, 34. Similarly, alignment of pod 12 with storage station 19 must be precisely controlled.

Figure 8:
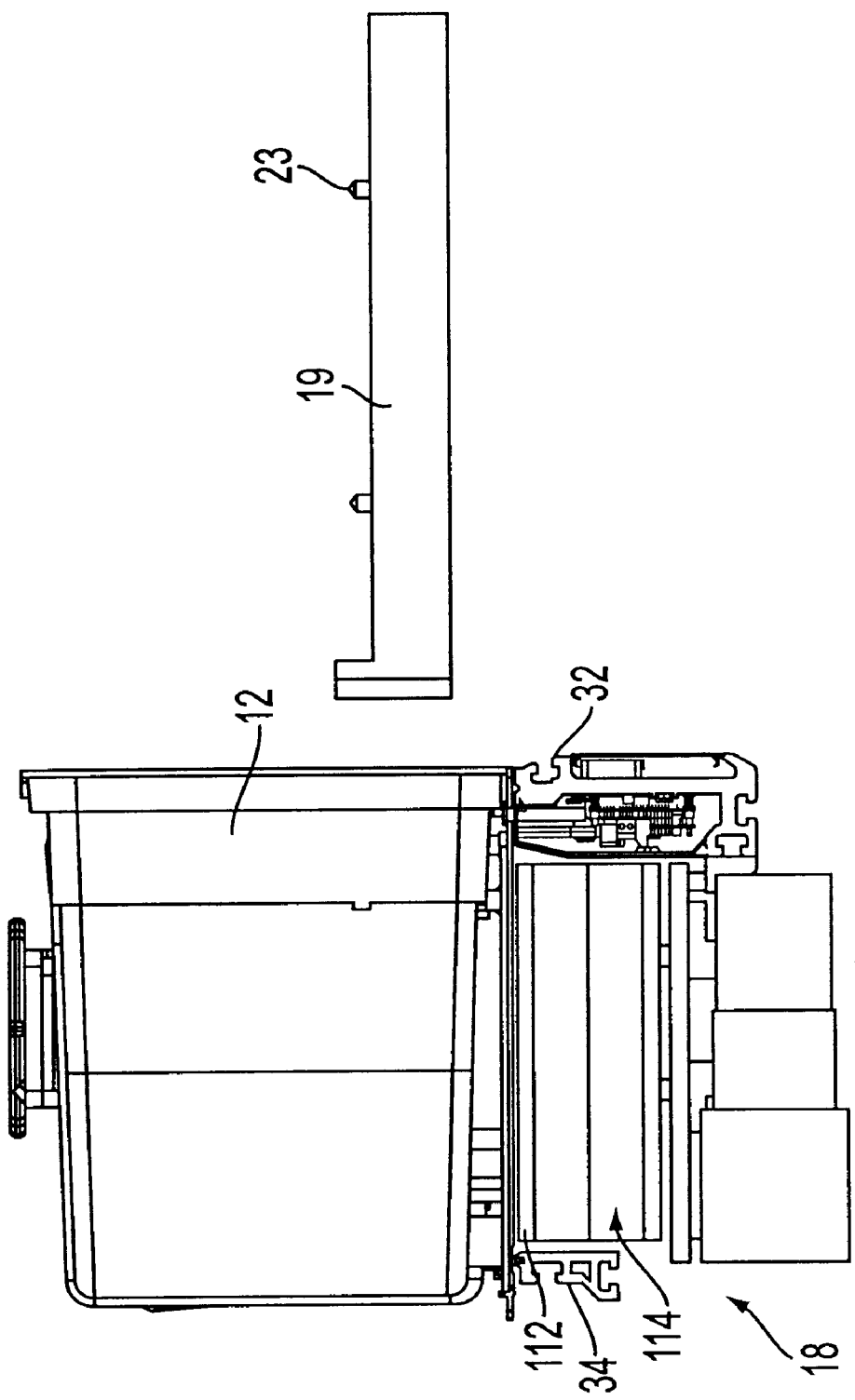
FIG. 8 is a side plan view of an alternative transfer assembly in accordance with the present invention, shown in the raised position supporting a transport pod.

As is known in the art, a load port commonly includes a plurality of kinematic pins to engage slots on the underside of a transport pod. Storage stations 19 are provided with similar kinematic pins 23, as shown in FIG. 8, which engage slots (not shown) on the underside of pod 12. Before pod 12 is lowered onto storage station 19, the slots must be aligned with kinematic pins 23 on storage station 19 One or more sensors on the conveyor system (not shown) verify the accurate placement of pod 12 on conveyor system 14 in a load/unload position for transfer of pod 12 between the conveyor and a load port by transfer assembly 18. Transfer assembly 18 is described in more detail in relation to FIGS. 8–11.

FIG. 8 shows transfer assembly 18 in a retracted position. In this position, transfer assembly 18 is below the level of rails 32,34 so that one or more transport pods 12 may be moved past a storage station 19 while pod 12 is positioned on storage station 19. Thus, transfer assembly 18 does not interfere with the operation of conveyor system 14.

Transfer assembly 18 generally includes a support 112 and a displacement assembly 114 which moves support 112 by raising and lowering it relative to the level of conveyor system 14 and storage station 19 and extending and retracting support 112 between conveyor system 14 and storage station 19. To return pod 12 to conveyor system 14, displacement assembly 114 is actuated to move support 112 from the retracted position shown in FIG. 8 to the raised position shown in FIG. 9. Next, the displacement assembly is actuated to move support 112 to the extended position shown in FIGS. 10 and 11, positioning support 112 under pod 12 on either side of storage station 19. Displacement assembly 114 is then actuated to raise support 112 relative to storage station 19 such that support 112 engages the underside of pod 12 and lifts pod 12 above storage station 19. Support 112 is then retracted by displacement assembly 114 back to the position shown in FIG. 9 and then lowered to the position shown in FIG. 8, with transfer assembly 18 retracted below the level of conveyor system 14 and pod 12 positioned on rails 32, 34.

Figure 11:
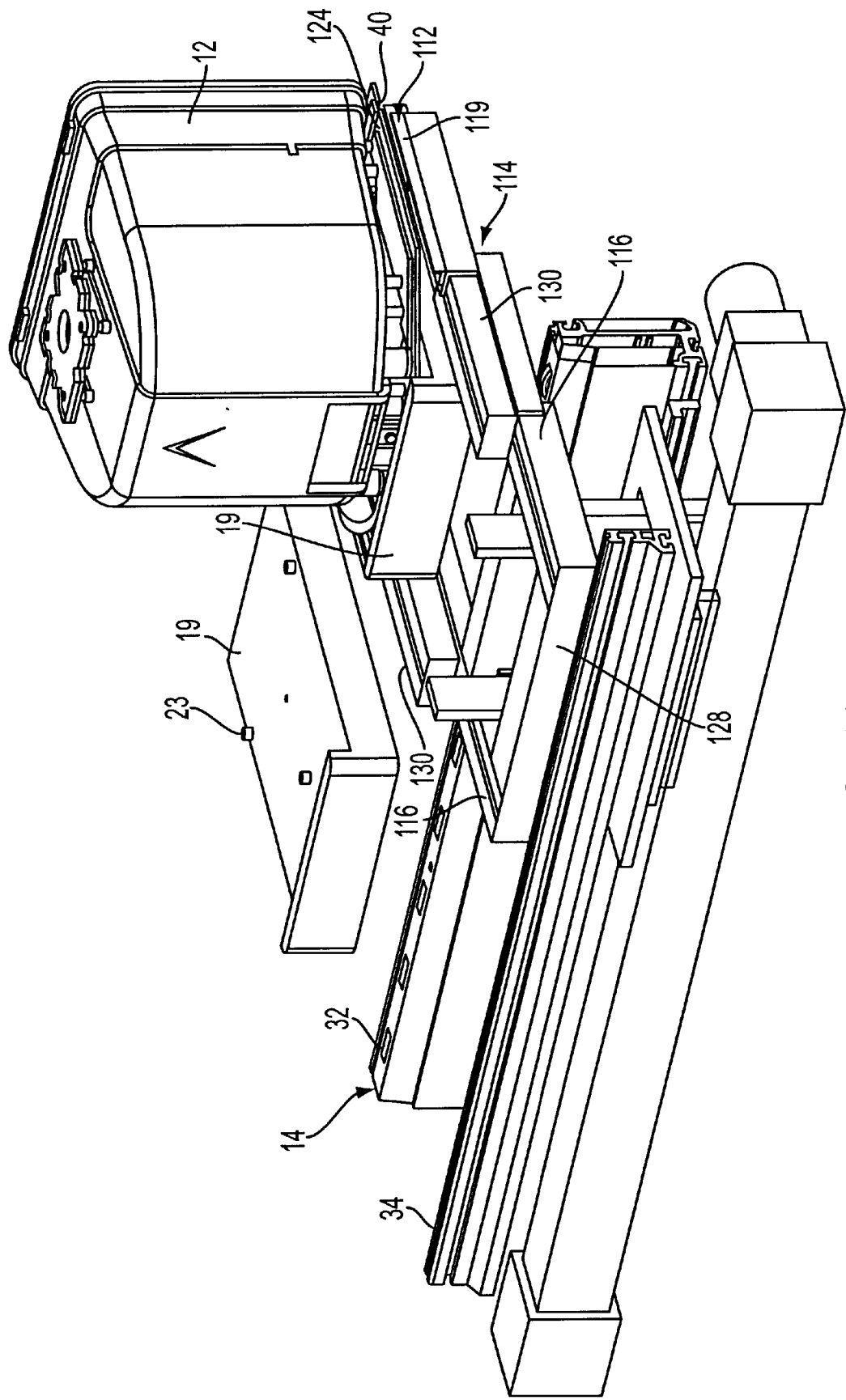
FIG. 11 is a pictorial view of the transfer assembly of FIG. 8, shown in the extended position prior to lifting a transport pod from a load port.
Figure 12:
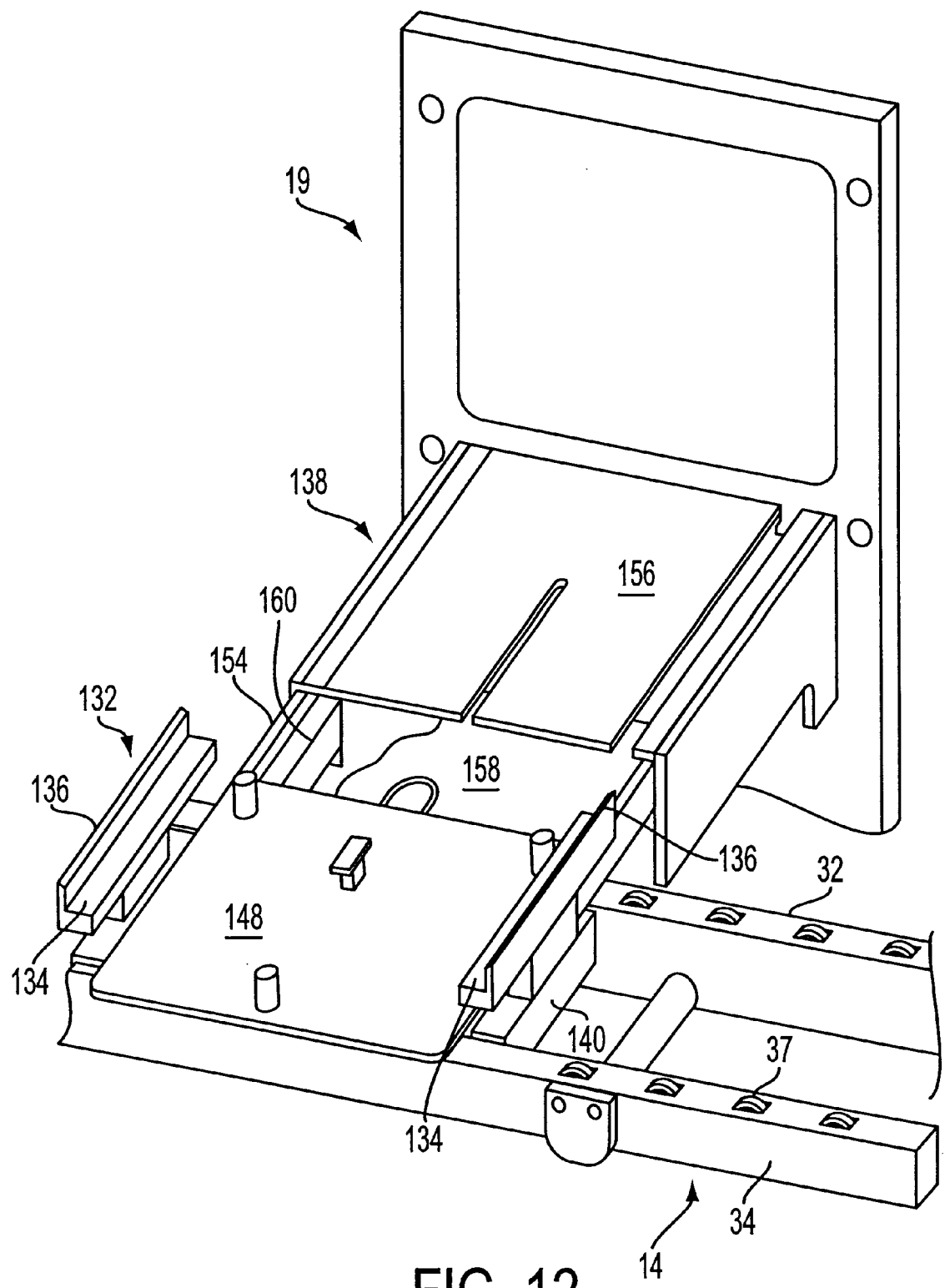
FIG. 12 is a pictorial view of an alternative transfer assembly in accordance with the present invention having an elevator assembly in a raised position and a shelf assembly in an extended position.

As shown particularly in FIG. 11, support 112 generally includes a pair of spaced apart support members 116. Support members 116 each include a L-shaped flange 119 shaped to support the outer edges of pod 12. A bead (not shown) projecting upwardly from flange 119 seats in an aperture 122 formed in a base plate 124 of pod 12 to stabilize pod 12 against shifting as it is moved between conveyor system 14 and storage station 19. Other means may be used to secure pod 12 to support members 116 instead of or in addition to the beads and L-shaped flanges 119. It is to be understood that the configuration of support members 116 is subject to considerable variation, and is dependent in part upon the configuration of the base of pod 12.

Figure 9:
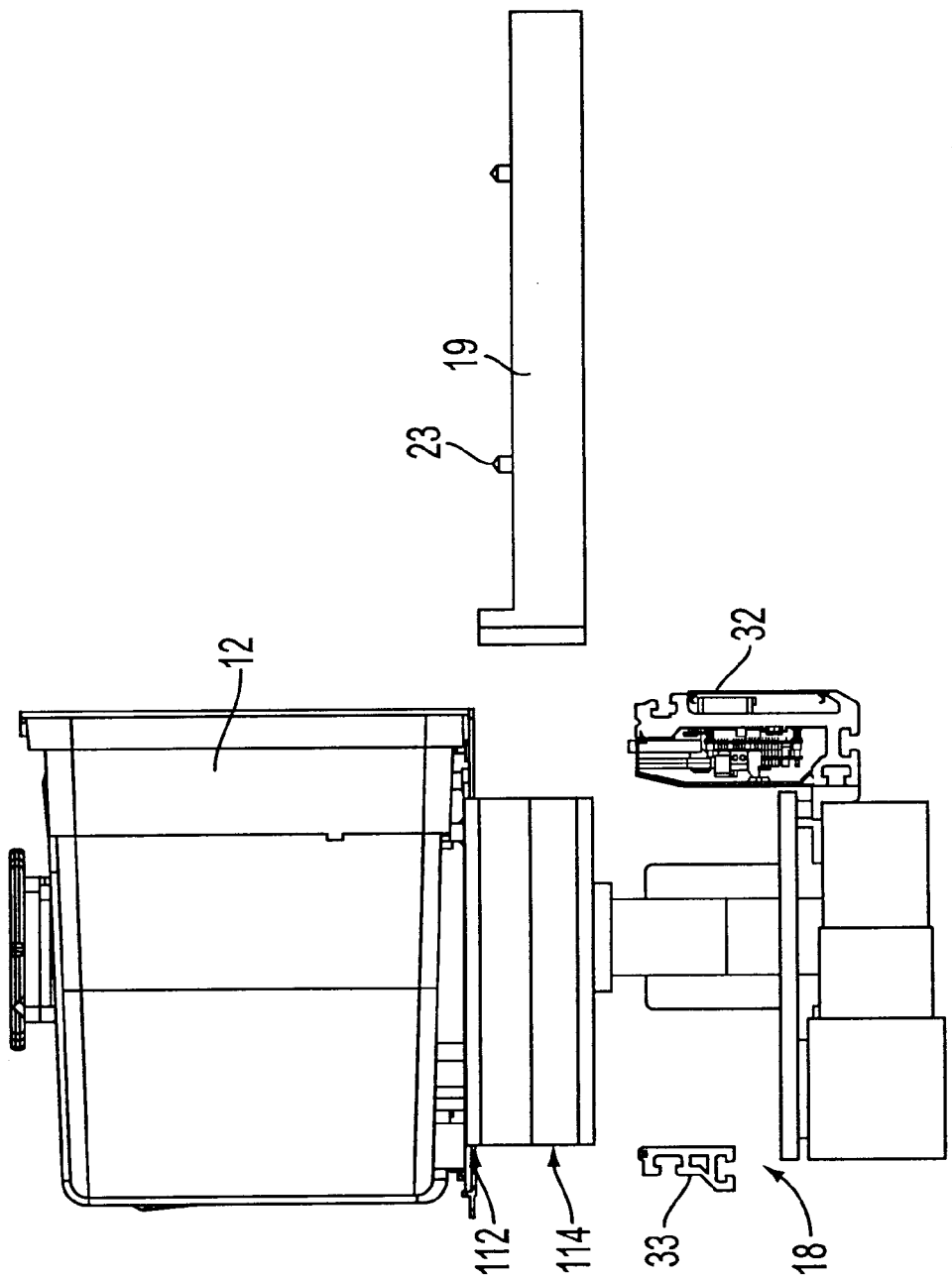
FIG. 9 is side plan view of the transfer assembly of FIG. 8, shown in the retracted position with the transport pod positioned on the conveyor system.
Figure 10:
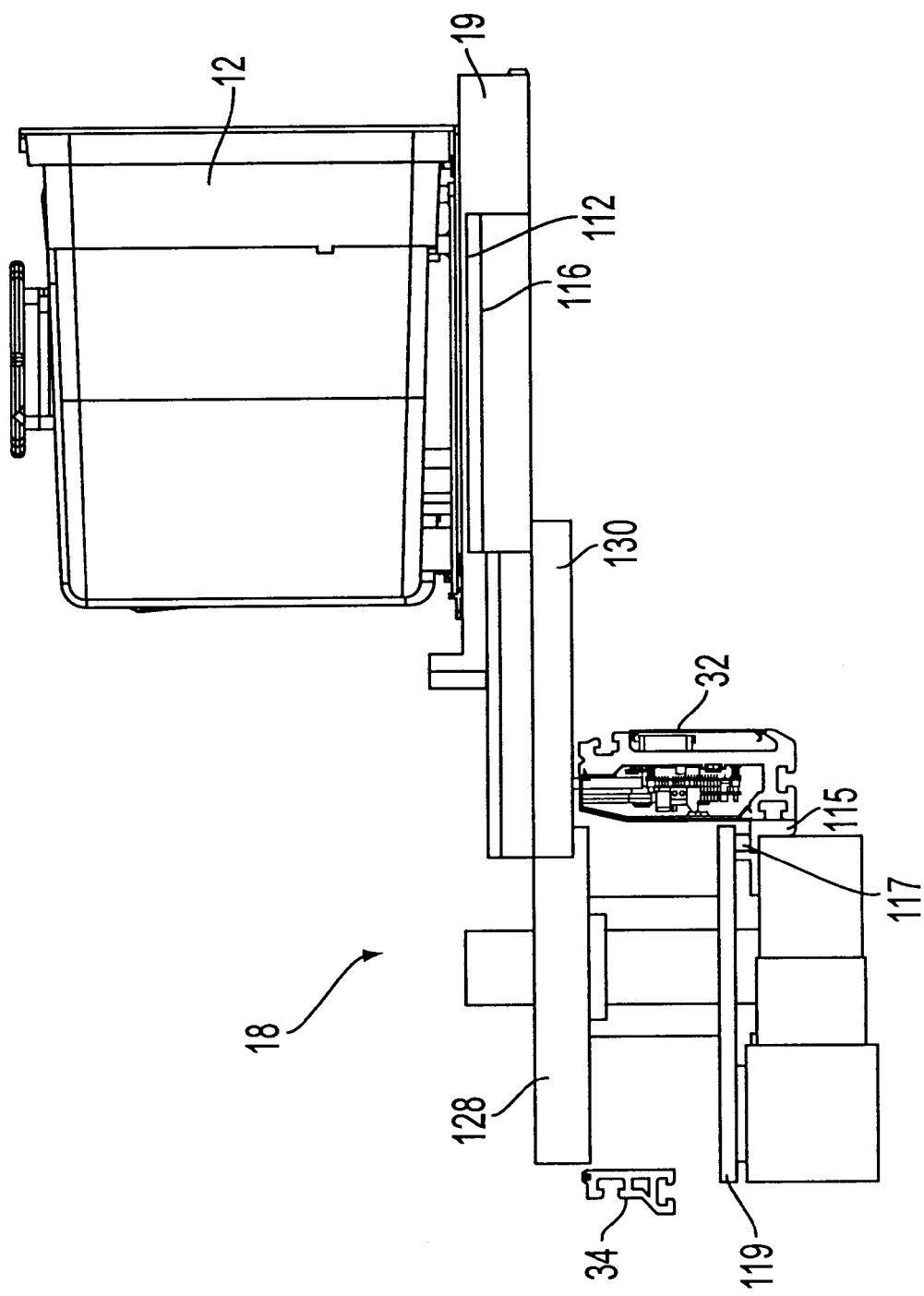
FIG. 10 is a side plan view of the transfer assembly of FIG. 8, shown in an extended position supporting the transport pod.

Displacement assembly 114 generally include a pair of spaced-apart slide assemblies for extending and retracting the support between storage station 19 and conveyor 14. Slide assemblies (not shown) are provided which include a plurality of links disposed in housings 128, 130 and support members 116, shown particularly in FIG. 11. Housings 128, 130 and support member 116 are shaped so that they nest together when retracted as shown in FIGS. 8 and 9. The slide assemblies (not shown) may be provided with links, pulleys and belts which are driven by a motor for extending and retracting slide assemblies. It is to be understood that a common motor or several separate motors may be employed, as well as other suitable components. Such a slide assembly is fully discussed in U.S. patent application Ser. No. 09/467,103 filed Dec. 10, 1999 the entire disclosure of which is incorporated herein by reference. It is also noted that the control system may be configured to prevent contact between the delivery robot and displacement assembly 114 when support 112 is in its extended position.

Turning now to an alternative embodiment shown in FIGS. 12–17, a modified transfer assembly 18 generally includes a lift or elevator assembly 132 for lifting the pod 12 or other article from conveyor system 14 and a support assembly 138 for supporting the article at storage station 19. Such a transfer assembly is fully disclosed in co-pending U.S. patent application Ser. No. 09/467,093 filed Dec. 10, 1999 the entire disclosure of which is incorporated herein by this reference. In this embodiment, elevator assembly 132 is positioned below conveyor system 14 between rails 32 and 34 such that the articles pass directly over the elevator assembly 132 as they are moved along conveyor system 14. However, it is to be understood that the transfer assembly may include other types of lift systems in accordance with this invention, including lift systems positioned to one side of the conveyor. A hoist-type lift system which engages the top of the article 12 to lift the article from conveyor system 14 may also be employed.

Figure 13:
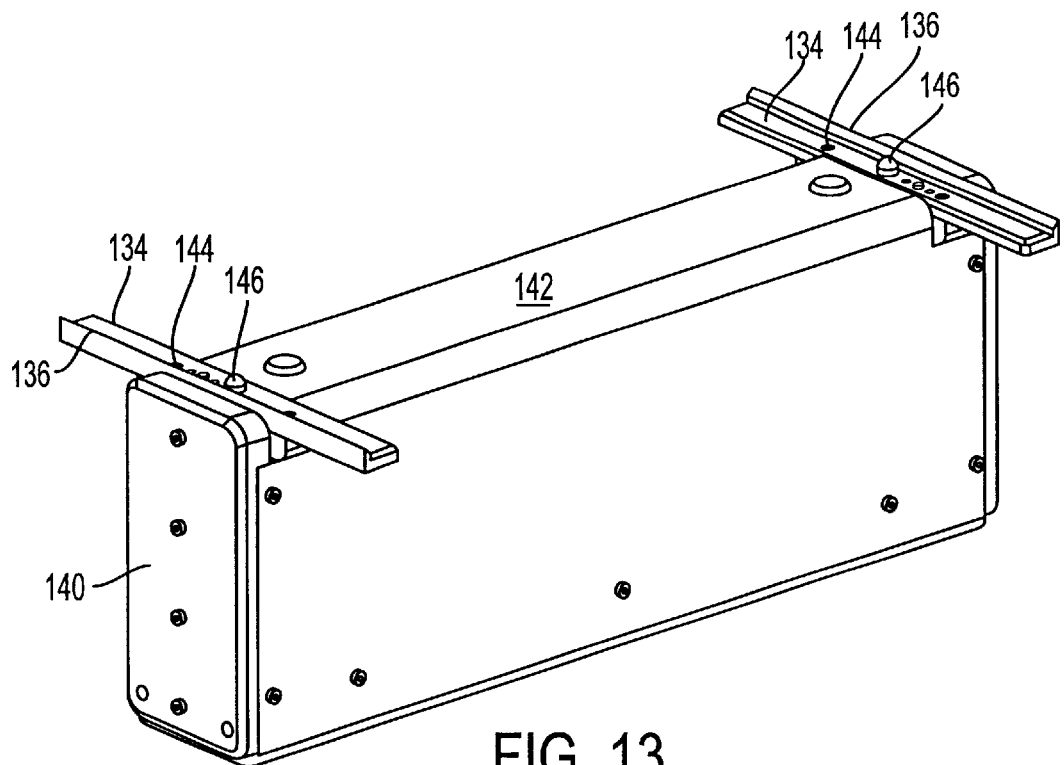
FIG. 13 is a pictorial view of the elevator assembly of the transfer assembly of FIG. 12, shown with the lift device in a lowered position.
Figure 14:
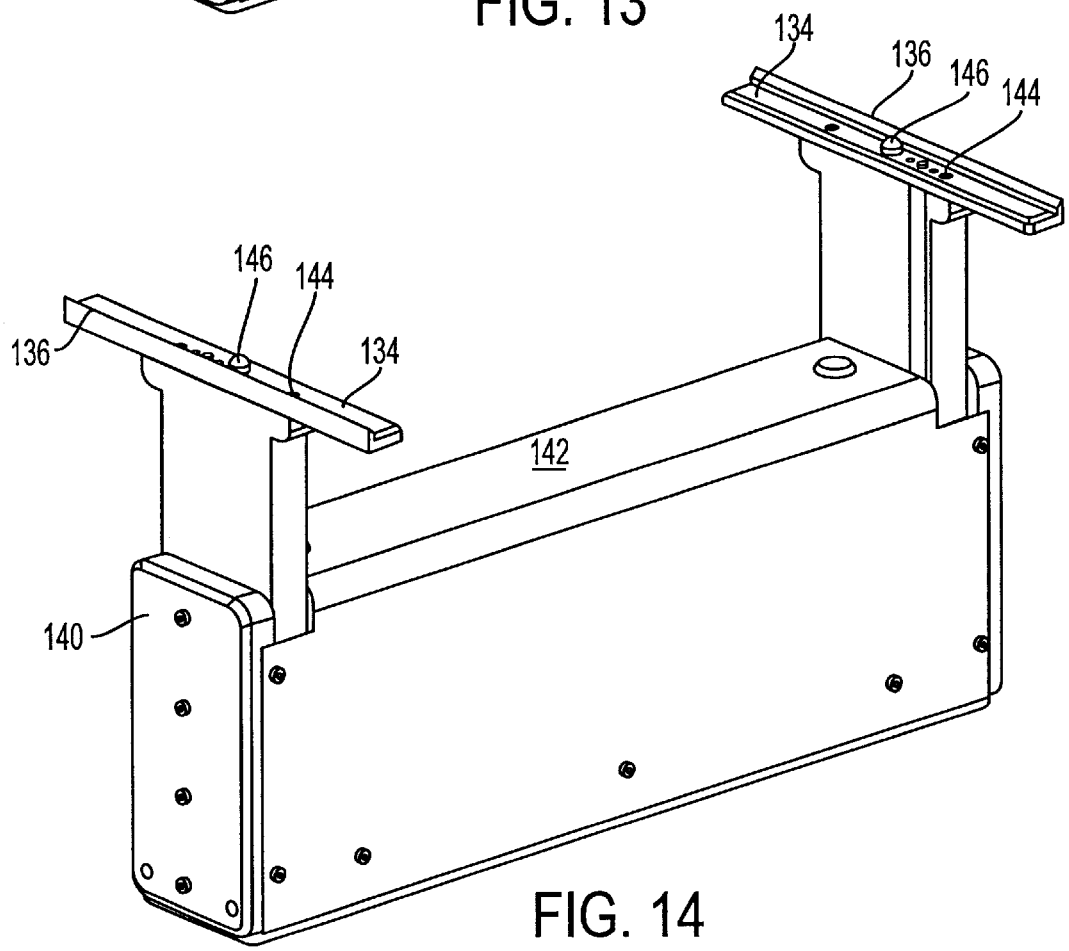
FIG. 14 is a pictorial view of the elevator assembly of the transfer assembly of FIG. 12, shown with the lift device in the raised position.

As shown particularly in FIGS. 13 and 14, lift or elevator assembly 132 generally includes at least one lift support member 134 which supports article 12 as it is lifted above conveyor system 14. In the illustrated embodiment, the elevator assembly 132 includes two spaced-apart lift support members 134 which are positioned to engage the bottom edges of transport pod or article 12 along the side edges of the pod and provide a substantial gap between lift support members 134. Lift support members 134 include an upward extending lip or flange 136 for preventing the pod from moving off of lift support members 134 in the event the pod shifts when carried by the lift support members. If desired, the height or shape of lip 136 may be adjusted to provide a greater or lesser amount of protection. While two lift support members 134 are used in the illustrated embodiment, it is to be understood that a greater or lesser number of lift support members may be employed in other embodiments of the invention. As discussed below, lift support member or members are preferably shaped to cooperate with a modified storage station 19 in the form of a support assembly 138 for the efficient transfer of the article from lift support members to support assembly 138.

Lift support members 134 are carried by a frame body 140 positioned below rails 32 and 34. In this embodiment, frame body 140 is mounted to support ties (not shown) secured to the frame structure of rails 32 and 34. However, it is to be understood that other means may be used to secure frame body 140 to conveyor system 14. Instead of mounting frame body 140 to conveyor system 14, the conveyor may be secured to the facility floor or to a separate frame structure.

Frame body 140, includes a removable cover (not shown) which houses the components of the elevator assembly 132. As shown in FIGS. 13 and 14, lift support members 134 are slidably coupled to the side walls of frame body 140 for vertical, linear movement of the lift support members 134 relative to frame body 140. It is to be understood that in other modifications both lift support members 134 may be coupled to a common slide-rail assembly. Moreover, the slide-rail assembly may be replaced by other types of systems for producing the vertical, linear movement of lift support members 134. Examples of such alternative systems include, but are not limited to, air cylinder lifting devices, pneumatic lifting devices and devices with a scissor-leg configuration. A drive system (not shown) controls the vertical movement of the linear slides. For example, a stepper motor (not shown) or other types of motors may be employed to control vertical movement of the linear slides.

Lift support members 134 are raised and lowered relative to frame body 140 and rails 32, 34 of the conveyor by activating the motor. FIG. 13 shows lift support members 134 in a lowered position where lift support members 134 are positioned below the upper surface on rails 32, 34. As lift support members 134 are moved upward, as shown in FIG. 14, they engage the underside of article 12. Continued upward movement of lift support members 134 lifts the pod from the conveyor until the pod is sufficiently elevated above conveyor system 14 to permit transfer of the pod to support assembly 138 as described in more detail below, with lift support members 134 bearing the weight of the pod until this transfer is completed. After the pod has been transferred, lift support members 134 are preferably lowered below the surface of conveyor system 14 to permit other articles to move past the elevator assembly. However, if desired, lift support members 134 may remain in a raised position until the pod is returned to the elevator assembly 132. After the pod is repositioned on lift support members 134, as described below, the motor is activated to lower the slides and the associated lift support members 134 to thereby deposit the pod on rails 32, 34 for further transport of the pod along conveyor system 14.

In the illustrated application, transfer assembly 18 is used to move pods filled with one or more semiconductor wafers. In view of the fragile nature of the contents of the pods, sensors are used to determine the proper positioning of the transport pod prior to transfer. In this embodiment of the invention, one or more sensors (not shown) are provided on conveyor system 14 upstream from a location directly opposite a storage station 19. The transport pod traveling along conveyor system 14 is stopped at this upstream position. The sensor or sensors detect the presence of a transport pod at this upstream position, and the transport pod is then indexed forward the precise distance between the upstream position and a position directly in front of storage station 19 and directly above the lift support member. At least one and preferably both of lift support members 134 also include sensors 144 for detecting when lift support members 134 contact the underside of the transport pod. In this manner, the sensors detect when the pod is properly seated on the lift support members before lift support members 134 lift the pod above conveyor system 14. In the illustrated embodiment, the sensors are optical sensors although other types of sensors may also be employed if desired. Pins 146 carried by lift support members 134 engage the underside of the pod 12 for additional stability of the pod 12 on lift support members 134. In other applications, such accurate control over the position of the article relative to lift support members 134 may not be necessary.

In this embodiment, as shown in FIG. 14, support assembly 138 is provided on storage station (not shown). In the illustrated application, where conveyor system 14 and transfer assembly 18 are used in the field of semiconductor processing, support assembly 138 may be mounted to a work station 16 or processing machine at a position away from the door or port of the machine and outside of an I/O zone proximate work station 16 and outside of a travel zone, as discussed in greater detail below. However, it is to be understood that support assembly 138 may also be mounted to a frame positioned directly in front and/or to the side of the processing machine.

Figure 17:
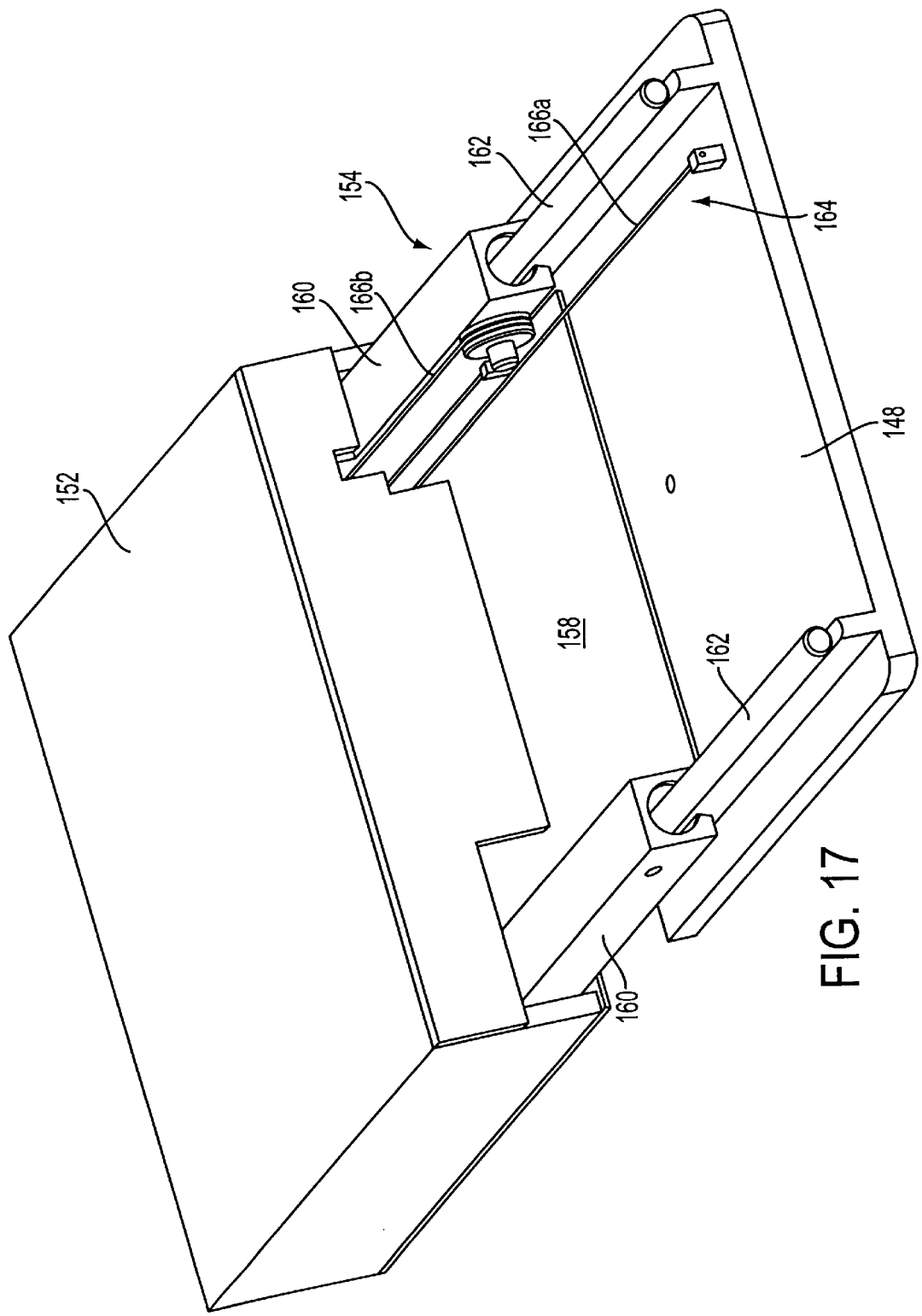
FIG. 17 is a bottom pictorial view of the support assembly of FIG. 12, shown with the shelf assembly in an extended position.
Figure 18C:
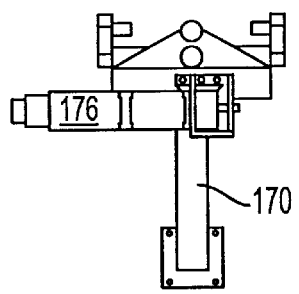
FIGS. 18(a)–(c) are front, side, and top views, respectively, of a robot arm having a vertical transport mechanism according to an embodiment of the invention.

Turning to FIGS. 15–17, support assembly 138 generally includes a shelf member or support member 148 for supporting the article. In the illustrated embodiment, where transfer assembly 18 is used for semiconductor processing, shelf support member 148 includes a plurality of upward-projecting retainers 150, commonly referred to as kinematic pins, which cooperate with the kinematic slots on the underside of the transport pod (not shown) to ensure the accurate positioning of the pod.

Shelf support member 148 is coupled to a frame body 152 such that shelf support member 148 slides between a closed position as shown in FIG. 15, and an open or extended position, as shown in FIGS. 15 and 16, with shelf support member 148 laterally supported from frame body 152 such that shelf support member 148 is positioned above conveyor system 14. It is to be understood that the total travel distance of shelf support member 148 may be increased or decreased depending upon the position of the conveyor relative to the storage station.

Shelf support member 148 is coupled to a movable carriage 154 which is carried by frame body 152 and is moved between the closed and extended positions by movable carriage 154. Movable carriage 154 is positioned below a fixed upper shield plate 156 of frame body 152. Shield plate 156 protects the interior components of support assembly 138. The interior components of movable carriage 154 are covered by a second shield plate 158 which also provides movable carriage 154 with increased tracking stiffness. Movable carriage 154 includes a pair of spaced-apart telescoping slides 160 mounted to movable carriage 154. In the illustrated embodiment, each slide 160 includes a plurality of ball bushings 162 (FIG. 17) to facilitate the extension and retraction of the slides.

The movement of movable carriage 154 is controlled by a drive system (not shown) carried by second shield plate 158. Preferably, the drive system includes a motor mounted to movable carriage 154, however, one should appreciate that a motor may instead be mounted to either frame body 152 or shelf support member 148. The motor may be operated in forward or reverse, with one direction being used to extend slides 160 and the other direction being used to retract slides 160. A cable assembly 164 facilitates extension of shelf support member 148 as well as retraction of slides 160 to move shelf support member 148 to the closed position. In the illustrated embodiment, two cables 166a and 166b are provided for controlling each slide. It is to be understood that other means may be used instead of or in addition to the cable assembly 164 to retract slides 160 into frame body 152.

The actuation of motor 146 is controlled by the control system. It is also noted that the control system may be configured to prevent contact between the delivery robot and support assembly 138 when shelf support member 148 is in its extended position. Preferably, the control system also controls the elevator assembly 132. Support assembly 138 also includes a limit switches (not shown) which may be used to monitor the movement of shelf support member 148 and detect when it has been moved to the fully extended position.

In operation, a transport pod or other article is transported along conveyor system 14 and positioned at the proper location. The precise control of drive system 36 of conveyor system 14 allows pod 12 to be accurately placed at a proper transfer position with minimal impact on the pod or its contents. However, it is to be understood that the transfer assembly of this invention may be used with other conveyor systems which rely on other means to stop the pod in front of the support assembly.

Once the pod has been delivered to the proper transfer position, the control system actuates elevator assembly 132 to lift pod 12 above conveyor system 14. Once the proper seating of pod 12 on support members 134 is detected by the sensors, lift support members 134 continue to rise until the pod 12 is moved to the elevated position. For example, elevator assembly 132 raises the pod 12 about 3 inches to 5 inches above the upper surface of conveyor system 14, preferably about 4 inches, although this distance may be increased or decreased if desired. Once the pod has been lifted to the desired elevation, the pod is held in place by support members 134.

Once support assembly 138 receives a signal from the control system indicating that the pod 12 has been lifted to the elevated position, movable carriage 154 extends from frame body 152, thereby moving shelf support member 148 between the underside of the pod 12 and conveyor system 14. Thus, the minimum elevation of the pod above the conveyor is determined in part by the height of shelf support member 148. Once shelf support member 148 is fully extended, the kinematic pins 150 are substantially aligned with the kinematic slots (not shown) on the underside of the transport device. A feedback signal is sent to the control system indicating that shelf support member 148 is in the fully extended position.

Support members 134 are lowered to deposit the pod 12 on shelf support member 148. In the illustrated embodiment, the downward movement of support members 134 continues until support members 134 are moved below the upper surfaces of rails 32, 34 so that the elevator assembly will not obstruct the passage of other pods moving along conveyor system 14.

Sensors 146 detect the absence of the pod 12 on support members 134 after the pod has been deposited on the shelf. The control system actuates a drive system to retract movable carriage 154 and move shelf support member 148 to the closed position thus positioning pod 12 in a storage position or buffer zone. Pod 12 is now available for transportation by delivery robot 20 to a work station 16 for processing when such work station 16 is so available.

Once processing of the wafers of the pod have been completed and the pod has been returned by robot 20 to a storage station 19, the process is reversed to return pod 12 to the conveyor. Specifically, the drive system is actuated to move shelf support member 148 to the extended position above conveyor system 14. Next, the elevator assembly 132 is activated to raise support members 134 to a predetermined position just below pod 12. Elevator assembly 132 then slowly raises support members 134 until the lift support members 134 contact the underside of the pod 12. Once the sensors detect the proper placement of the pod on lift support members 134, support members 134 are raised to lift the pod from shelf support member 148. Shelf support member 148 is then retracted, and support members 134 lowered to a predetermined position just above the level of the conveyor. Support members 134 are then lowered slowly until the pod 12 is deposited on the conveyor. When the sensors 144 detect that the pod is no longer in contact with support members 134, the elevator lowers support members 134 to the fully retracted position.

Turning again to FIGS. 2–5, storage stations 19 provide buffer locations used to store pods 12 during transfer between conveyor system 14 and work station 16 by delivery robot 20. As discussed in detail above, transfer assembly 18 removes pods 12 from conveyor system 14 and places them into a storage or buffer position on storage station 19 in such a position that pod 12 may be accessed by delivery robot 20. Referring to FIG. 4, storage stations 19 are preferably located in a buffer zone which is adjacent to conveyor path of conveyor system 14. For example, storage stations 19 are located in an upper buffer zone as shown in FIG. 4. Additional storage stations 19' may also be located in one or more additional buffer zones. For example, FIG. 5 shows storage stations 19' located below the level of conveyor system 14 and below the level of storage stations 19.

Each load port 22 of work stations 16 defines a work station zone, also known as a work station loading zone, input/output zone, or I/O zone. For example, FIG. 5 shows load ports 22 which are generally located at the same level below conveyer 14 and below the level of additional storage stations 19'. Thus, a work station loading zone or I/O zone is generally located below the level of additional storage stations 19' which generally define and are located within a buffer zone. It should be appreciated that the location of the I/O zone may vary depending upon the configuration of the work stations used. For example, the I/O zone may be located above the level of additional storage stations 19' as is shown by the upper I/O zone shown in FIG. 4. It should also be appreciated that load ports 22 are often spaced from each other by a substantial horizontal distance in which additional storage stations 19" may be located on the same level as the I/O zone but between load ports 22. See FIG. 5. Thus, an I/O zone and a buffer zone may coexist on a single level, however, because each zone is dedicated to a particular purpose, the I/O zone and the buffer zone are mutually exclusive.

Figure 20A:
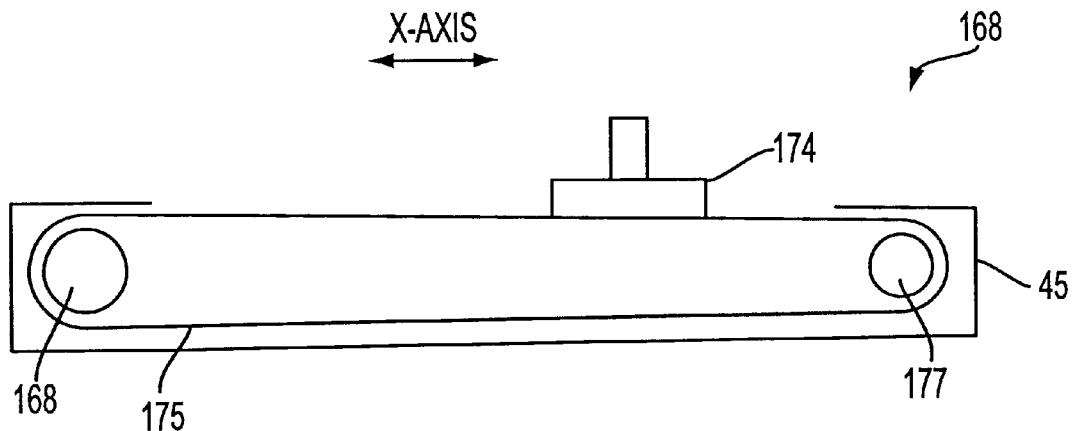
FIGS. 20(a)–(d) are schematic views of various embodiments of a robot arm x-axis actuator in accordance with the present invention.
Figure 21:
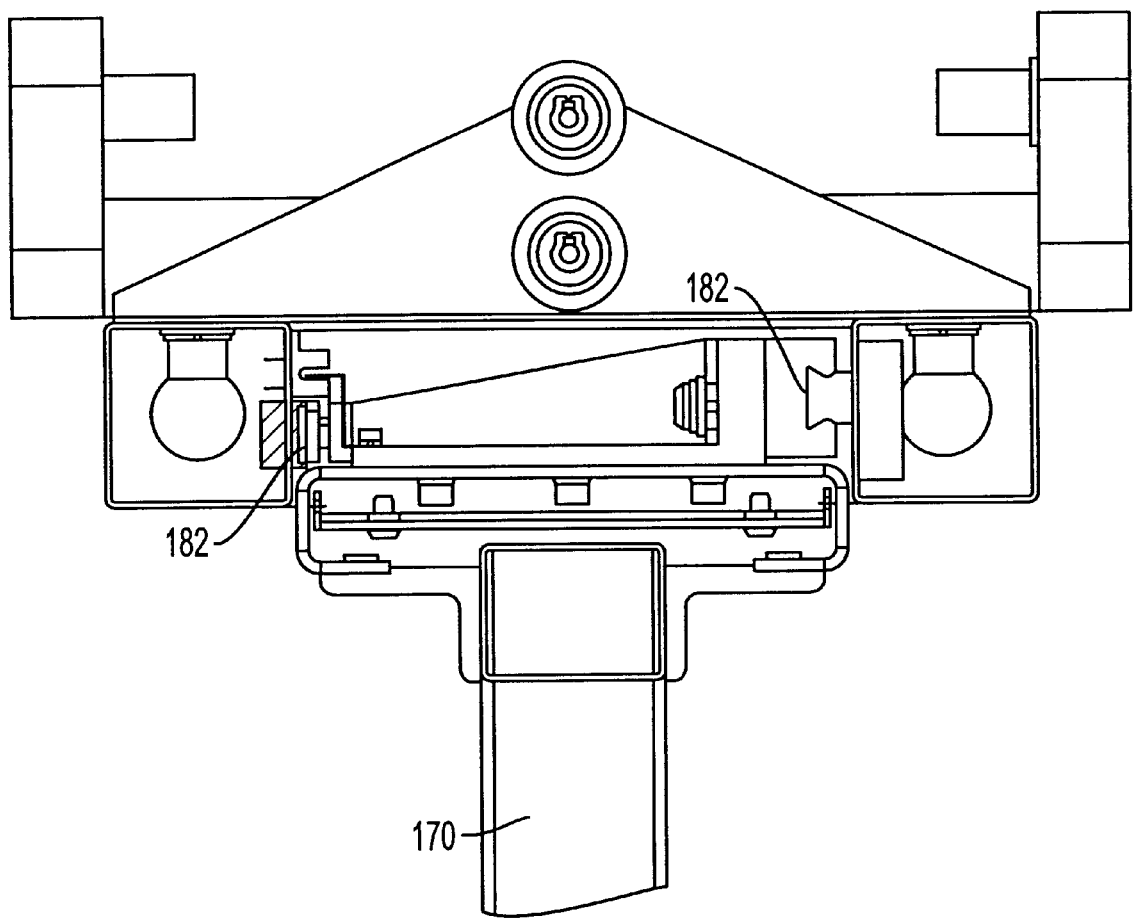
FIG. 21 is a sectional view of the robot arm taken along line 21 in FIG. 18(a).

Delivery robot 20 has two axes of motion. The first axis, an x-axis, runs along conveyor system 14 and is substantially horizontal. Delivery robot is supported by the superstructure 45 for motion along the x-axis. Superstructure 45 is modular in length to allow configurations of two and more work stations 16 located in a bay. It is noted that a bay may be 100 feet long or longer and several delivery robots can be deployed along that length. Delivery robot 20, however, can also be configured to serve as few as one work station 16. The x-axis motion is controlled by an x-axis actuator 168, as shown in FIGS. 2 and 20(a)–(d), which receives commands from the control system discussed above which is also responsible for coordinating conveyor system 14, transfer assemblies, and work stations 16. Superstructure 45 is preferably attached to the ceiling and supports delivery robot 20. Referring to FIG. 20(a), a robot frame 174 is attached to a belt 175 that is tensioned between x-axis actuator 168 controlled by the computer control system and a free wheel 177. When x-axis actuator 168 moves belt 175, robot frame 174 moves in the x-axis. Frame 174 is supported by superstructure 45 as shown in FIGS. 2 and 5 and rides on bearings (not shown) coupled to tracks 179 of superstructure 45.

Figure 20B:
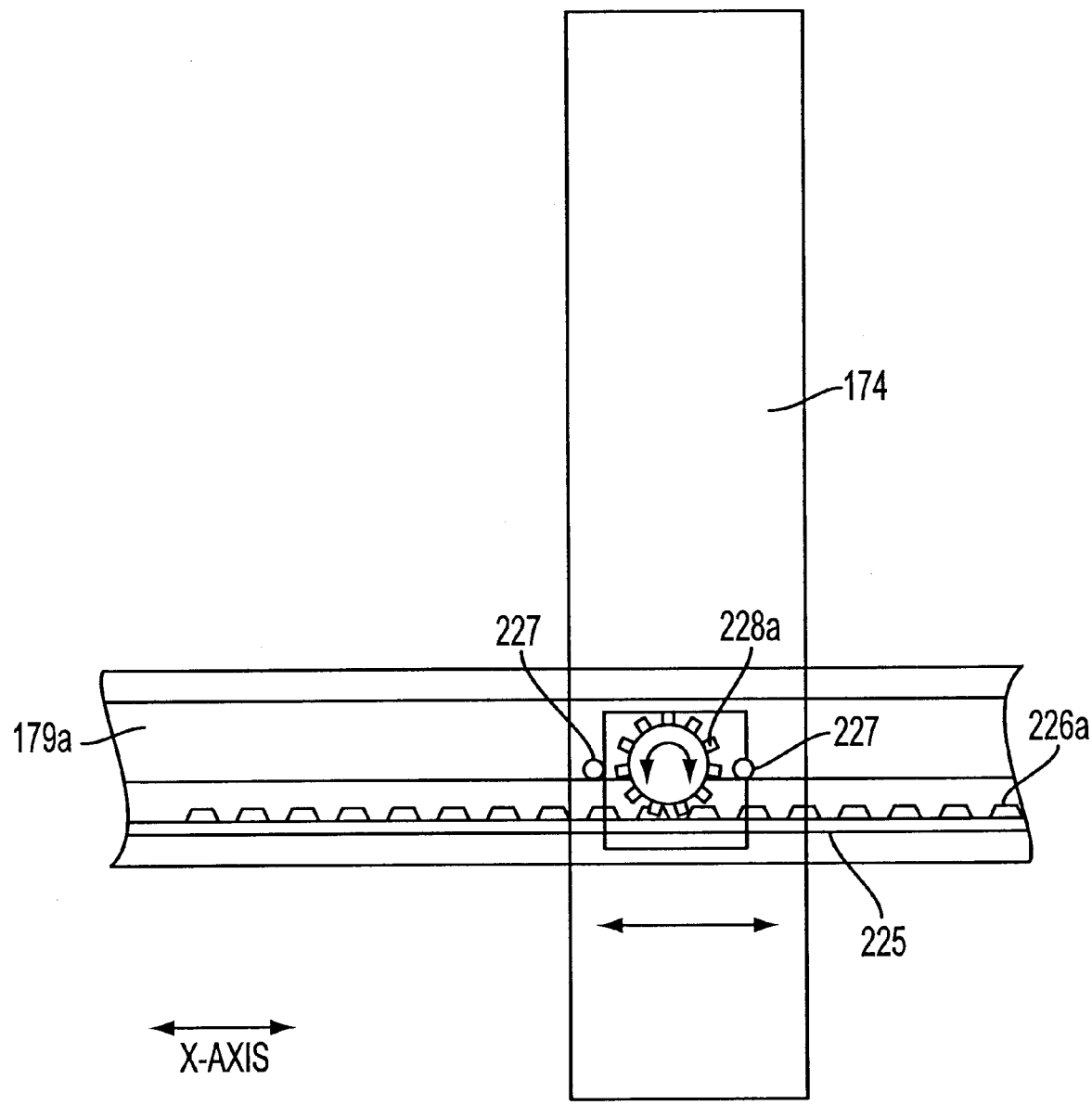

Alternative configurations for controlling the x-axis motion of delivery robot 20 and moving frame 174 maybe used. For example, FIG. 20(b) shows a gear motor 225 and a plurality of rollers 227 attached to robot frame 174 such that they move with frame 174 along track 179b of the superstructure. Preferably a toothed drive wheel such as a toothed pulley 228b or a toothed gear, is operably attached to an output shaft of gear motor 225. Preferably toothed pulley 228b is rigidly attached to the output shaft with no dissemble relative motion. The weight of the delivery robot including frame 174, the robot arm, the article gripper, and gear motor 225 and along with that of the article is transferred to and supported by the superstructure through rollers 227. At least two rollers 227 are used in order to constrain frame 174 to move in the x-axis direction only. Toothed pulley 228b engages a toothed guide such as a toothed belt 226b which is fixed to track 179 of the superstructure by a fastener. The fastener may included one or more of various means including clamps, rivets, screws, adhesive bonding or other suitable means. One should appreciate that a pinion rack or other suitable means may be used in place of toothed belt 226b. Rotation of gear motor 225 moves robot frame 174 and the delivery robot in one direction along the x-axis while reverse rotation of gear motor 225 moves the delivery robot in the opposite direction.

Figure 20C:
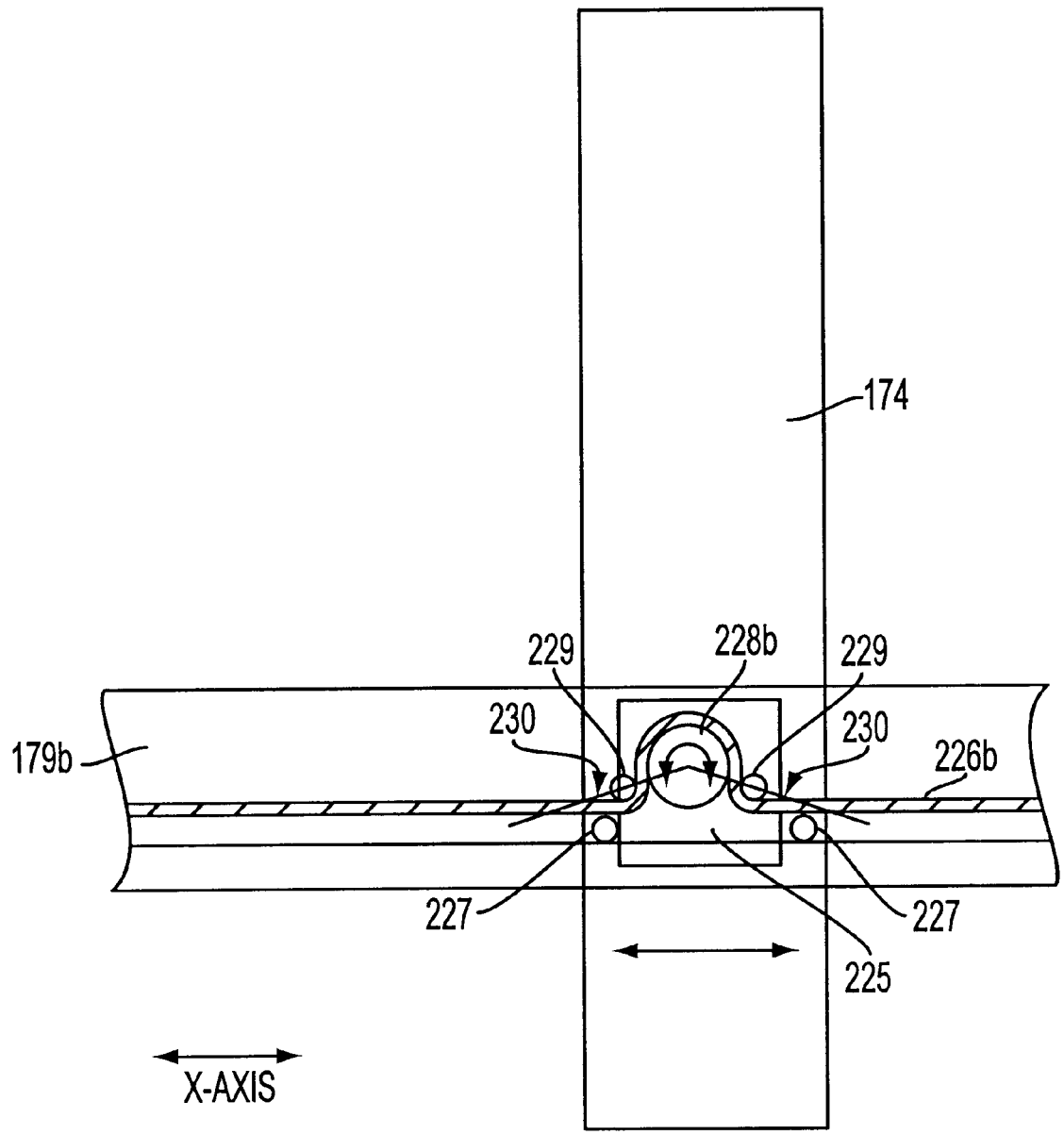

Another embodiment similar to that shown in FIG. 20(b) is shown in FIG. 20(c). Instead of the toothed gear and belt configuration described above, a pre-loaded flexible guide such as pre-loaded cable 226c is operably guided around and operably engaged with drive wheel such as drive pulley 228c and fixed in a pre-loaded manner to track 179c of the superstructure. Pulley 228c is attached to the output shaft of gear motor 225 in the same manner as toothed pulley 228b discussed above. Idler wheels 229 constrain fixed cable 226b with respect to drive pulley 228b to provide favorable engagement with drive pulley 228b. Preferably engagement of cable 226c with drive pulley 228c extends at least 180 degrees around drive pulley 228b, as is indicated by arrow 230. Alternatively, a toothed pulley may be engaged with a pre-loaded toothed belt 226 which is trained around the toothed pulley in the same manner as cable 226c is trained around drive pulley 228c.

Figure 20D:
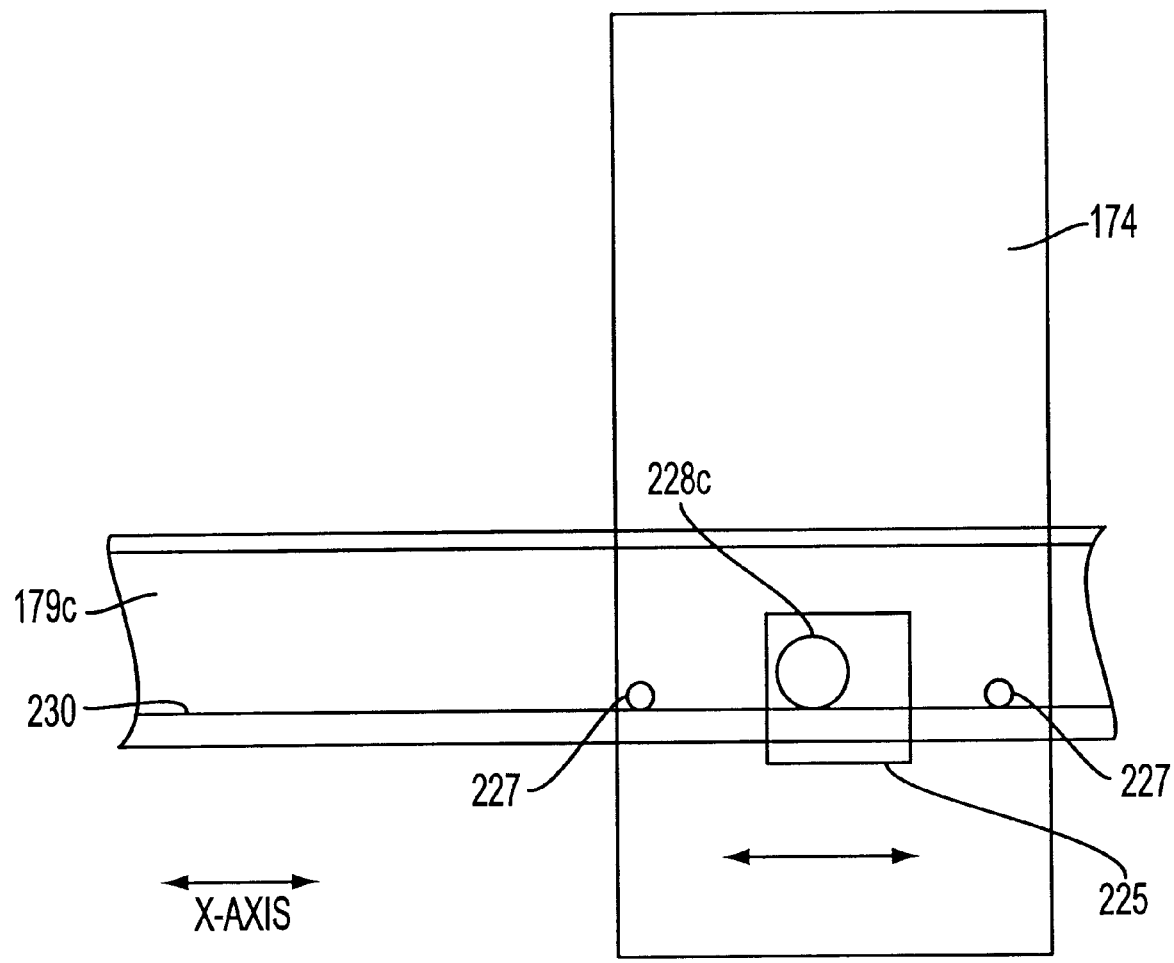

Yet another embodiment for the x-axis drive is shown in FIG. 20(d). A drive wheel such as cushioned drive wheel 228d is attached to the output shaft of gear motor 225. Drive wheel 228d frictionally engages a bearing surface 230 on track 179d of the superstructure. Track 179d also supports rollers 227 in such a manner that robot frame 174 is constrained motion within the x-axis. Rollers 227 transfer the weight of the delivery robot including frame 174 and other components to track 179d of the superstructure 45c in a similar manner as discussed above. Activating gear motor 225 selectively rotates drive wheel 228d to move robot frame 174 along track 179c in the x-axis direction. It should be appreciated that drive wheel 228d need not actually be cushioned provided its circumference frictionally engages bearing surface 230 of track 179d. For example, rubber or plastic wheels may be used provided they frictionally engage bearing surface 230.

The x-axis drive configurations of FIGS. 20(b), 20(c), and 20(d) are preferred in that these embodiments are easily configured for varying lengths of travel. For example, the only significant modification necessary to increase the travel length of the device shown in FIG. 20(d) is modifying the length of track 179d. The x-axis drive of FIGS. 20(b) and 20(d) are preferred in that installation and replacement of a robot frame 174 with x-axis drive is simpler than with other configurations. For example, the robot frame 174 of FIG. 20(b) may be replaced without training a belt or cable around a corresponding pulley or roller. The x-axis drive of FIG. 20(b) is preferred in that the position of robot frame 174 may be precisely determined and controlled because the position effectively indexed by cooperating teeth. Thus the x-axis drive shown in FIG. 20(b) is the preferred embodiment. One should appreciate, however, that other suitable x-axis drives for robot frame 174 may also be used.

Referring to FIG. 5, travel zones are provided which allow unobstructed motion of pod 12 by robot 20. An express travel zone may be provided to allow relatively high speed transfer of a pod along the x-axis. For example, delivery robot 20 may quickly pod 12 along path ETZ between two work stations 16, between a work station 16 and a storage station 19, or between two storage stations 19 which are spaced a significant distance from one another. A local travel zone may be provided to allow local transfer between two stations which are located relatively close to one another. For example, delivery robot may transport a pod from storage station 19" to an adjacent work station along path LTZ.

Delivery robot 20 also moves along a second axis, az-axis. The z-axis is angled with respect to the x-axis. Preferably, the z-axis is substantially perpendicular to the x-axis and is substantially vertical. It should be appreciated that other configurations are possible in which the x-axis, the z-axis, or both are angled with respect to horizontal and vertical axes, provided the alignments thereof provide for two-dimensional travel of delivery robot 20 within a travel plane. Motion along the z-axis allows delivery robot 20 to move pod 12 between a lower load port level and an upper elevation above the upper storage stations 19. A chimney zone may be provided which allows unobstructed vertical travel along the z-axis to transport a pod vertically between the buffer zones, the travel zones and the I/O zones. For example, delivery robot may transport pod 12 along a chimney zone, generally designated by path CZ in FIG. 5.

Figure 19:
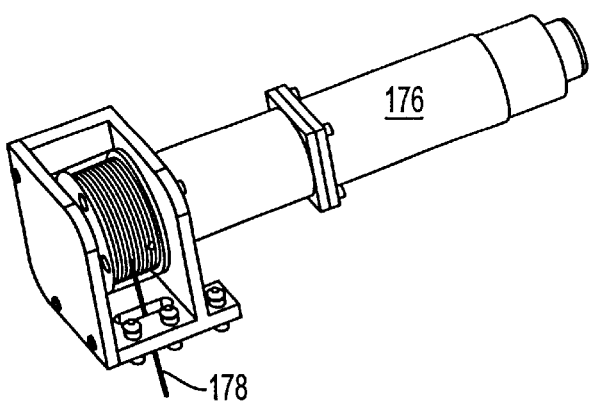
FIG. 19 is a perspective view of a robot arm z-axis actuator shown in FIG. 18(a).

The travel zone of the z-axis is a substantially constant height where the x-axis travel of robot 20 can safely move pod 12 horizontally between work stations 16. This is where a majority of the x-axis travel takes place. The z-axis travel of robot 20 is controlled by a servo system 176 as shown in FIGS. 2 and 19 which also receives commands from the control system.

Figures 18A, 18B:
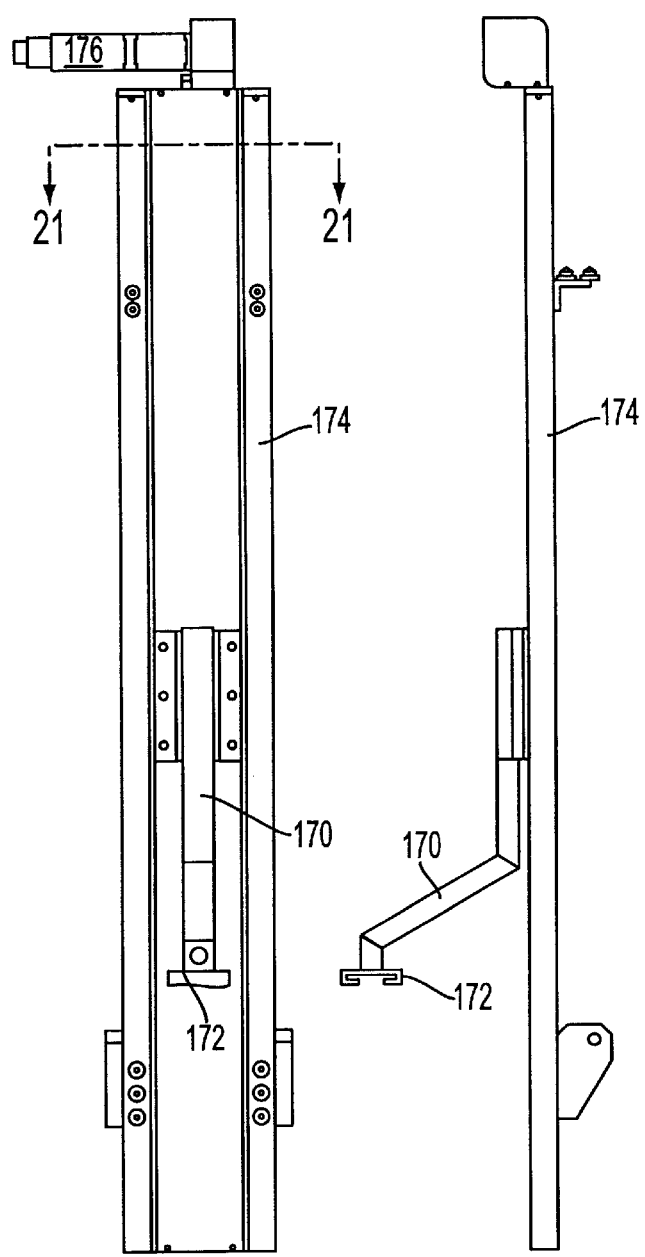

Delivery robot 20 includes an arm 170 that moves along the z-axis and includes an article gripper configured to engage a mushroom-shaped handle H on the top of the transport pod. The gripper can be passive or active. FIG. 18(b) shows an embodiment of the invention having a passive gripper. Delivery robot 20 includes a robot frame 174 that is supported by the superstructure 45 for movement along the x-axis. Z-axis servo system or actuator 176 is disposed on frame 174 and includes a servo motor or other type of motor that is controllable by the control system. Z-axis actuator 176 controls a cable 178 connected to a robot sled 180. Robot sled 180 moves freely in the z-axis direction on bearings 182 and under control of z-axis actuator 176. Arm 170 extends from robot sled 180 at an angle. It should be appreciated that arm 170 may instead extend perpendicularly from robot sled 180. Arm 170 has a gripper that in FIGS. 18(a) and 18(b) is a C-shaped passive gripper 172. Gripper 172 is configured to fit under the mushroom-shaped handle of pod 12 and to lift pod 12 by its handle. Gripper 172 fits around the handle by moving the arm 170 into position from the side of the handle and then lifting arm 170 to engage the transport pod. A risk associated with this technique is that the control system must carefully move the arm 170 from the side for the passive gripper 172 to engage the handle. One advantage of this technique is that the transport pod is physically engaged with the gripper and there is no possibility of dropping the transport pod.

FIGS. 22–26 show various embodiments of active grippers 184 which may be provided on arm 170 of robot sled 180 instead of passive gripper 172. Preferably, active grippers 184 are configured to be failsafe such that interruption of electrical power will not result in disengagement of pod 12. Active grippers 184 are more mechanically complex due to the incorporation of failsafe gripper mechanisms, however, the movement of the arm 170 is less complex. Active grippers can engage transport pods 12 from above and no side motion of arm 170 is necessary. In operation, delivery robot 20 is positioned so that active gripper 184 is above the transport pod handle and then lowered by z-axis actuator 176. Active gripper 184 then engages the handle and robot sled 180 is raised with the pod. Robot sled 180 than carries the transport pod to a desired destination.

FIG. 22 shows details of active gripper 184 where a motor 186 is coupled to a cable 188. Cable 188 is routed around guides 192a–192d and held at each corner by springs 194a–94d. When motor 186 relaxes cable 188, springs 194a–194d bias cable 188 to an open position that allows active gripper 184 to be lowered over the transport pod handle H. When motor 186 tensions cable 188, cable 188 is pulled taught about guides 192 into a closed position that engages the transport pod handle H and supports pod 12 as it is transported from one location to another by delivery robot 20.

FIG. 23 shows a modified active gripper 184a having sliding blades 198 which are interconnected by guide cables 202, 204. Guide cables 202 and 204 oppose each other whereby sliding blades 198 have equal and opposing motions. Cable 202 wraps around pulley 206 and cable 204 wraps around pulley 208 and, together, synchronize the motion of sliding cams 198. Actuation of motor 204 draws sliding blades 198 toward one another a substantially equal amount to engage the handle H of pod 12.

FIG. 24 shows a modified active gripper 184b having pins 210 that are movably controlled by a solenoid 212 to engage handle H. Springs 214 bias pins 210 into an engagement position thereby providing a failsafe configuration preventing disengagement of handle H in the event of power failure.

FIG. 25 shows a modified active gripper 184c having a pair of sliding camdriven blades 216. Motor 218 or other suitable linear actuator displaces pins 220 in the direction of arrow A which causes blades 216 to move in the direction of arrow B to engage and disengage handle H.

FIG. 26 discloses a modified active gripper 184d having a motor 222 which drives worm screws 224 and 226. Screws 224 and 226 have opposing threads whereby actuation of motor 222 in one direction with cause nuts 228 and 230 to move away from one another. Actuation of motor 222 in a reverse direction draws nuts 228 and 230 toward one another. Nuts 228 and 230 are operably connected to jaws 232 which are pivotally mounted on a housing 234 of active gripper 184d in such a manner that jaws 232 pivot between engaged and disengaged positions for gripping and releasing handle of pod 12. Preferably active gripper 184d is mounted on robot arm 170 via a floating shaft 236 which allows limited movement of active gripper 184d (along with any transport pod supported therefrom) with respect to robot arm 170. Preferably gripper 184d is provided with sensors 185 in order to indicate relative alignment of the gripper 184d and robot arm 170 in order to determine acceleration of the robot arm and other desired measurements. For example, sensors 185 may indicate accurate and stable placement of pod 12 on kinematic pins 23.

Returning specific attention to delivery robot 20, FIG. 5 shows various transport pods 12 at different locations during transport by integrated system 10. For simplicity, pods 12 will be associated with their respective positions. In operation, a pod 12 advances along the conveyor path on conveyor system 14 in conveyor pod position 12a. Transfer assembly 18 discussed in detail above is used to transfer the transport pod to storage station 19 in buffer pod position 12b. The robot is then instructed by the computer control system to employ vertical z-axis actuator 176 and horizontal x-axis actuator 168 to bring robot sled 180 up into position with active gripper 184 above a mushroom-shaped transport pod handle H. Sled 180 is lowered slightly and active gripper 184 engages the transport pod handle H. Sled 180 is then raised by z-axis actuator 176, and z-axis actuator 176 and x-axis actuator 168 work in combination with the transport pod at travel pod position 12c. The object is to deliver pod 12 to a work station 16 and place pod 12 on load port 22. In particular, the control system controls robot 20 to deliver pod 12 to load port 22 of work station 16, as indicated by work station pod position 12d. Preferably, sensors 185 in gripper 184 indicate accurate placement of pod 12 with respect to work station 16. Active gripper 184 is released and active gripper 184 disengages transport pod handle H. Robot sled 180 is then raised and robot 180 moves on to other transfer tasks. To retrieve a transport pod from work station pod position 12d, the above steps are performed in reverse.

One should appreciate that multiple delivery robots maybe provided to operate on a common track of the superstructure in order to simultaneously transfer pods in the manner discussed above. In the case of lower throughput demands of a set of work stations, one delivery robot may be sufficient to transfer pods between the conveyor, the storage stations, and the work stations. In the case of higher throughput demands, two or more delivery robots may be provided to operate on a common track of the superstructure. Multiple robots have the further advantage that additional robots may serve as a backup should one robot fail. For example, when one of a plurality of robots provided on a track fails, throughput of the work stations serviced by the robots may be diminished, however, the work stations may still be used because the backup robot may still service the work stations. When multiple robots are used, the control system must be configured to control the multiple robots and to prevent accidents therebetween.

In addition to the storage stations 19 located adjacent conveyor system 14, additional buffer locations in the form of additional storage stations 19' may be provided at the level of an I/O zone between or adjacent load port 22. For example, storage station 19" may be located between load ports 22 of adjacent work stations 16. Accordingly, a buffer zone and an I/O zone may be provided at the same height with respect to the floor or with respect to the conveyor system of a bay, as shown in FIGS. 4 and 5. Such additional buffer storage locations 19" may not be directly accessible from conveyor system 14, but would be accessible by delivery robot 20.

FIG. 27 shows an additional embodiment where delivery robot 20 is additionally designed to travel in the y-axis. FIG. 27 shows such an embodiment where at least an arm 172a is moveable in the y-axis to pick a transport pod up from conveyor system 14 and to deliver the transport pod to a storage station 19 or to a work station 16. Such an arm is constructed in two parts with a fixed member 238 and a moveable member 242. Moveable member 242 has a gripper 244, that can be a fixed or active gripper, and is moveable in the y-axis to pick up a transport pod and to deliver it to a storage station or a work station. Moveable member 242 is driven by an actuator and a belt drive (not shown) having a structure similar to that shown in FIG. 20. Moveable member 242 preferably rides on bearings on rails (not shown) located within fixed member 244 and is controlled by an actuator (not shown) such as a servo motor. In this manner, an embodiment of integrated system 10 that is provided with the three-axis delivery robot 20a shown in FIG. 27 may be used with or without transfer assembly 18 discussed above.

The integrated system according to the present invention provides many advantages including the ability to safely move articles, such as but not limited to transport pods, between elevated buffer or storage stations, load ports of work stations, additional buffer or storage stations.

Having disclosed exemplary embodiments and the best mode, modifications and variations may be made to the disclosed embodiments while remaining within the scope of the invention as defined by the following claims.

What is claimed is:

1. An integrated system for transferring an article comprising:

a conveyor for moving the article along a conveyor path;

an elevator system having a lift device configured to engage the article carried by said conveyor and to raise the article above said conveyor, said lift device being movable between a stand-by position allowing movement of articles along said conveyor path past said lift device, and an actuated position with said lift device holding the article above said conveyor;

a storage support assembly for supporting the article within a buffer zone;

a displacement mechanism for moving the article between said actuated position of said lift device and said storage support assembly;

a work station support assembly for supporting the article within a work station zone proximate to a work station;

a transfer arm configured to move in a first direction and a second direction, said movement controlled by a first actuator and second actuator respectively;

a gripper mounted on said transfer arm and adapted to engage the article; and a controller for controlling said first and second actuators, whereby selective movement of said transfer arm within said first and second directions transfers the article between said storage support assembly and said work station support assembly.

2. An integrated system for transferring an article according to claim 1 wherein said conveyor is adapted to be mounted to a ceiling and positioned in front of said work station.

3. An integrated system for transferring an article according to claim 1 wherein said conveyor is adapted to be mounted to a ceiling and positioned above said work station.

4. An integrated system for transferring an article according to claim 1 wherein said displacement mechanism is located on one of said storage support assembly and said elevator system.

5. An integrated system for transferring an article according to claim 1 wherein said first direction is a substantially horizontal position substantially parallel to said conveyor path, and said second direction is a substantially vertical direction.

6. An integrated system for transferring an article according to claim 1 wherein at least one of said first and second actuators are electric servo motors.

7. An integrated system for transferring an article according to claim 1 wherein at least one of said first and second actuators are electric step motors.

8. An integrated system for transferring an article according to claim 1 wherein said gripper is adapted to actively engage the article.

9. An integrated system for transferring an article according to claim 1 further comprising:
a mounting structure for mounting said transport system to a ceiling;
a transfer arm frame movably mounted on said mounting structure, said transfer arm frame movable in said first direction; and
a transfer arm sled movably mounted on said transfer arm frame, said transfer arm sled movable in said second direction;
wherein said transfer arm further is mounted on said transfer arm sled.

10. An integrated system for transferring an article according to claim 9 further comprising:
a transfer arm frame belt operably connected to said transfer arm frame;
a transfer arm frame belt actuator mounted on said mounting structure for moving said transfer arm frame belt and said transfer arm frame in said first direction.

11. An integrated system for transferring an article according to claim 9 wherein said second actuator is mounted on said transfer arm sled and is operably coupled to said transfer arm by a cable.

12. An integrated system for transferring an article according to claim 9 wherein said transfer arm further comprises:
a fixed member mounted on said transfer arm sled; and
a movable member movably mounted on said fixed member, said movable member movable in a third direction substantially perpendicular to said first and second directions.

13. An integrated system for transferring an article according to claim 9 further comprising a transfer arm frame actuator mounted on said transfer arm frame for moving said transfer arm frame in said first direction.

14. An integrated system for transferring an article according to claim 13 further comprising:
a toothed drive wheel operably driven by said transfer frame actuator; and
a toothed guide mounted on said mounting structure, said toothed guide operably engaging said toothed drive wheel.

15. An integrated system for transferring an article according to claim 13 further comprising:
a drive wheel operably driven by said transfer frame actuator; and
a flexible guide mounted on said mounting structure, said flexible guide operably engaging said drive wheel.

16. An integrated system for transferring an article according to claim 13 further comprising:
a drive wheel operably driven by said transfer frame actuator; and
a bearing surface located on said mounting structure, said drive wheel operably and frictionally engaging said bearing surface.

17. An integrated system for transferring an article comprising:
a conveyor path;
a conveyor for moving the article along said conveyor path;
an elevator system having a lift device configured to engage the article carried by said conveyor and raise the article above said conveyor, said lift device being movable between a stand-by position with said lift device positioned for the movement of articles past said lift device along the conveyor, and an actuated position with said lift device holding the article above the conveyor; and
a buffer zone;
a storage support assembly for supporting the article within a buffer zone;
a displacement mechanism for moving the article between one said actuated position of said lift device and a respective said storage support assembly;
a work station zone proximate to a work station;
a work station support assembly for supporting the article within said work station zone;
a travel zone;
a transfer arm configured to move in a first direction and a second direction within said travel zone, said movement controlled by a first actuator and second actuator respectively;
a gripper mounted on said transfer arm and adapted to engage the article; and
a controller for controlling said first and second actuators, whereby selective movement of said transfer arm within said first and second directions transfers the article between said buffer zone and said work station zone.

18. An integrated system for transferring an article according to claim 17 wherein said travel zone extends in said first direction.

19. An integrated system for transferring an article according to claim 17 wherein said first direction is a substantially horizontal position substantially parallel to said conveyor path, and said second direction is a substantially vertical direction.

* * * * *